(12) United States Patent
Itagaki et al.

(10) Patent No.: US 9,203,351 B2
(45) Date of Patent: Dec. 1, 2015

(54) OFFSET CANCELLATION WITH MINIMUM NOISE IMPACT AND GAIN-BANDWIDTH DEGRADATION

(71) Applicant: MEGACHIPS CORPORATION, Osaka-shi (JP)

(72) Inventors: Takahiro Itagaki, Nagareyama (JP); Sarath Chandrasekhar Venkatesh Kumar, San Jose, CA (US); Anand Gopalan, San Jose, CA (US); Shankarram Athreya, San Jose, CA (US)

(73) Assignee: MegaChips Corporation, Osaka-shi (JP)

( * ) Notice: Subject to any disclaimer, the term of this patent is extended or adjusted under 35 U.S.C. 154(b) by 109 days.

(21) Appl. No.: 13/838,171

(22) Filed: Mar. 15, 2013

(65) Prior Publication Data
US 2014/0266440 A1    Sep. 18, 2014

(51) Int. Cl.
*H03F 3/45* (2006.01)
*H03F 1/26* (2006.01)
*H03F 1/14* (2006.01)

(52) U.S. Cl.
CPC .............. *H03F 1/26* (2013.01); *H03F 3/45183* (2013.01); *H03F 3/45475* (2013.01); *H03F 3/45941* (2013.01); *H03F 1/14* (2013.01); *H03F 2200/375* (2013.01); *H03F 2200/408* (2013.01); *H03F 2203/45212* (2013.01); *H03F 2203/45512* (2013.01); *H03F 2203/45521* (2013.01); *H03F 2203/45528* (2013.01); *H03F 2203/45544* (2013.01); *H03F 2203/45562* (2013.01); *H03F 2203/45641* (2013.01); *H03F 2203/45642* (2013.01); *H03F 2203/45681* (2013.01); *H03F 2203/45702* (2013.01)

(58) Field of Classification Search
CPC ........................................................ H03F 3/45
USPC ............................... 330/259, 253, 261, 260, 9
See application file for complete search history.

(56) References Cited

U.S. PATENT DOCUMENTS 4,490,682 A * 12/1984 Poulo .................................. 330/9
6,288,604 B1 * 9/2001 Shih et al. ......................... 330/9

(Continued)

FOREIGN PATENT DOCUMENTS

| CN | 1790286 A | 6/2006 |
| CN | 101263674 A | 9/2008 |
| WO | WO 2009/066690 A1 | 5/2009 |

OTHER PUBLICATIONS

Combined Office Action and Search Report issued Jan. 6, 2014 in Chinese Patent Application No. 201010221054.2 with partial English language translation.

*Primary Examiner* — Henry Choe
(74) *Attorney, Agent, or Firm* — Oblon, McClelland, Maier & Neustadt, L.L.P.

(57) ABSTRACT

A system for cancelling offset includes a gain circuit. The gain circuit may include a transistor circuit connected to a pair of input nodes and configured to convert an input signal to an output signal so that the output signal has a gain compared with the input signal. The gain circuit also may include a pair of output nodes configured to receive the output signal from the transistor circuit. The gain circuit is configured to cause a voltage change at one of the output nodes relative to another output node, in response to the gain circuit receiving a feedback offset correction signal. This effectively cancels at least a portion of an offset in the output signal.

32 Claims, 23 Drawing Sheets

(56) References Cited

U.S. PATENT DOCUMENTS

| | | | |
|---|---|---|---|
| 6,661,288 B2 * | 12/2003 | Morgan et al. | 330/258 |
| 6,710,645 B2 * | 3/2004 | Isken et al. | 330/9 |
| 6,903,593 B2 | 6/2005 | Wang | |
| 7,245,181 B2 | 7/2007 | Sanduleanu et al. | |
| 7,321,259 B1 | 1/2008 | Shumarayev | |
| 7,466,193 B2 * | 12/2008 | Kim | 330/9 |
| 7,483,506 B2 | 1/2009 | Yajima et al. | |
| 7,508,259 B2 * | 3/2009 | Tsuchi | 330/51 |
| 7,555,087 B1 | 6/2009 | Asaduzzaman et al. | |
| 7,642,846 B2 * | 1/2010 | Yan | 330/9 |
| 7,733,179 B2 * | 6/2010 | Forejt | 330/258 |
| 7,843,264 B2 * | 11/2010 | Davierwalla et al. | 330/253 |
| 8,339,195 B2 * | 12/2012 | Lee et al. | 330/9 |
| 8,643,437 B2 * | 2/2014 | Chiu et al. | 330/253 |
| 2003/0112833 A1 | 6/2003 | Kamiya | |
| 2009/0080890 A1 | 3/2009 | Miura et al. | |
| 2010/0196010 A1 | 8/2010 | Miura | |
| 2010/0272448 A1 | 10/2010 | Kubo | |
| 2013/0108272 A1 | 5/2013 | Miura | |

* cited by examiner

OFFSET CANCELLATION WITH MINIMUM NOISE IMPACT AND GAIN-BANDWIDTH DEGRADATION

BACKGROUND

The background description provided herein is for the purpose of generally presenting the context of the disclosure. Work of the presently named inventor(s), to the extent the work is described in this background section, as well as aspects of the description that may not otherwise qualify as prior art, are neither expressly nor impliedly admitted as prior art against the present disclosure.

High speed limiting amplifiers used in optical communication and high speed analog front-ends used in electrical signaling require the use of high bandwidth amplifiers that can amplify small input signals and/or equalize channel loss, preferably with as little signal degradation as possible and with a minimum of additionally required components. While improvements to semiconductor processing technologies have led to circuits with somewhat greater reliability, linearity, and noise characteristics, comparable advances in circuit abstraction and layout continue to play a role in the sustained improvement of amplifier performance, and in some instances, are the only means to overcoming emerging technological obstacles.

One parameter affecting the performance of amplifiers is low frequency (e.g., DC) offset, which may take the form of difference voltages or currents between the differential output terminals. In general, differential signals transmitted through a high-speed amplifier may suffer distortions or imperfections due to a semiconductor device mismatch, interconnect mismatch, and/or trace defects along the amplifier chain. These imperfections, often caused by random mismatches in the signal path resulting from the semiconductor etching process, may disadvantageously cause variations in the common-mode of the differential signal, lead to lower sensitivity, and can also impact chip yield. Frequently, these random variations may present themselves as a DC offset on the differential signal. Thus, offset in amplifier circuits tends to degrade circuit performance.

SUMMARY

Aspects of this disclosure are concerned with providing circuit architectures designed to combat offset in differential amplifier configurations by introducing implementations of feedback calibration loops. In addition to compensating for offset in differential amplifiers, these implementations may also contribute other beneficial aspects to the circuit performance, such as enhanced gain, enhanced bandwidth, reduced component overhead and more.

In a first aspect, a gain circuit (or a gain stage) is introduced that boosts the current gain of a differential pair amplifier stage. The gain circuit has an offset canceling circuit that receives an offset correction signal from a feedback circuit to cancel any offset at the output of the gain circuit. Therefore, in the gain circuit, metal oxide semiconductor ("MOS") transistor current sources can perform dual roles by both eliminating offset using a feedback signal and by providing an increase in the amplifier's output current. By supplementing the amplifier output current with current sourced from a MOS feedback circuit, the amplifier transconductance, defined as the ratio of the amplifier's output current to input voltage, can be increased. Transconductance is directly proportional to the amplifier's gain, so a second result of the addition of the offset cancelling circuit is a larger overall gain factor for the amplifier. By simultaneously eliminating offset and increasing amplifier gain, a current boosting embodiment may be implemented with fewer components than would be necessary if each task were addressed independently.

In another aspect, an offset canceling circuit that extends the bandwidth of the differential amplifier stage is provided. In this circuit, a cross-connected MOSFET stage act as a negative impedance converter, generating a negative capacitance that looks both inductive and resistive. This negative impedance combines with a mutually source-connected capacitor, a load connected capacitor and a load-connected resistor to form a virtual RLC network known as a differential negative $g_m$ circuit. The output nodes of the differential pair are now part of an active oscillator circuit, the result of which is an increase in energy to the differential pair output resulting from the oscillation energy. Thus, the oscillator injects energy into the differential pair output nodes, creating a resonant peaking current gain at frequency $\omega_{peak}$ and resulting in a moderate increase in gain across the remaining operational bandwidth of the amplifier circuit. This increase can extend the usable bandwidth by increasing the width of the frequency band above a given gain level.

Accordingly, some aspects disclosed herein are configured to eliminate a low frequency (DC) offset signal while simultaneously enhancing the gain of the base (uncompensated) differential pair circuit, and in at least one instance further increasing the bandwidth of the differential pair.

According to one aspect, a system for cancelling offset includes a gain circuit. The gain circuit may include a transistor circuit connected to a pair of input nodes and configured to convert an input signal to an output signal so that the output signal has a gain compared with the input signal. The gain circuit also may include a pair of output nodes configured to receive the output signal from the transistor circuit. The gain circuit is configured to cause a voltage change at one of the output nodes relative to another output node, in response to the gain circuit receiving a feedback offset correction signal. This effectively cancels at least a portion of an offset in the output signal.

A further aspect, the first gain circuit may include a transistor differential pair and an offset cancellation circuit so that the offset cancellation circuit is connected to the output signal from the first gain circuit and receives the feedback offset signal from the feedback path. Additionally, the offset cancellation circuit may be configured to cause a change in voltage drop from a constant voltage source in the transistor differential pair in response to receiving the feedback offset signal, thereby reducing or cancelling the offset.

According to another aspect, a circuit for cancelling offset in an amplifier may include a feedback path comprising a low-pass filter and a gain circuit. The gain circuit may include an input to receive an input signal, a pair of output nodes, a transistor differential pair attached to the input, and an offset cancellation circuit connected to the output nodes. The transistor differential pair is configured to convert the input signal to an output signal at the output nodes, and the offset cancellation circuit is configured to receive a feedback offset signal from the feedback path. The gain circuit changes the voltage at the first output node relative to the second output node to cancel an offset between the output nodes in response to the offset cancellation circuit receiving the feedback offset signal.

According to yet another aspect, a method is provided. An input signal is received at a first gain circuit, where the first gain circuit may include a transistor differential pair and an offset cancellation circuit. An output signal is outputted to a pair of output nodes, the output signal comprising an offset between the output nodes. At the offset cancellation circuit, a feedback offset signal is received from a feedback path. The feedback path is configured to filter a low-frequency offset from the output signal. The offset is cancelled at the output nodes in response to the first gain circuit receiving the feedback offset signal.

BRIEF DESCRIPTION OF THE DRAWINGS

Various embodiments of this disclosure that are provided as examples will be described in detail with reference to the following figures, in which like numerals reference like elements, and wherein.

DETAILED DESCRIPTION OF THE EMBODIMENTS

Figure 1:
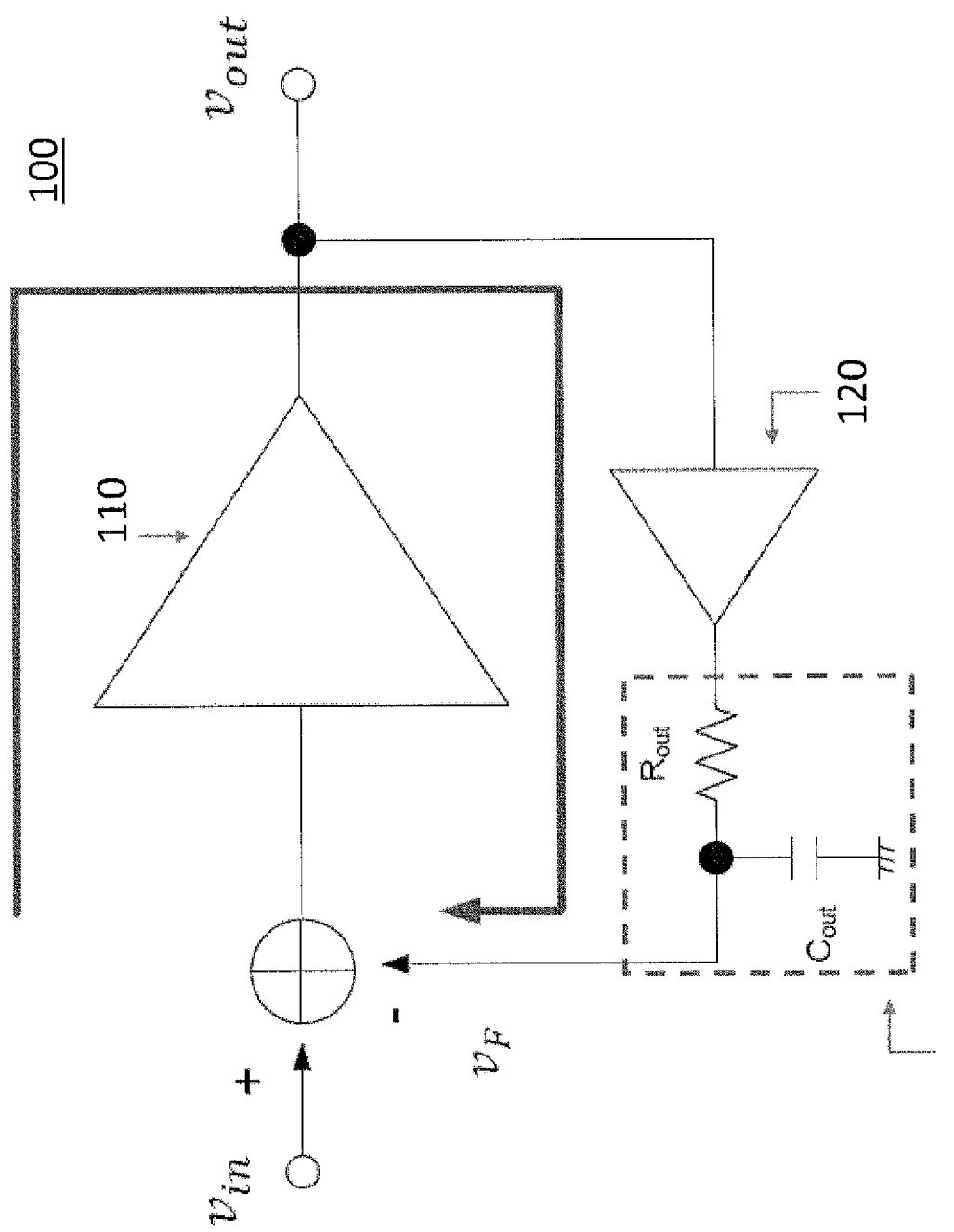
FIG. 1 illustrates a feedback circuit according to one embodiment.

The disclosure is described in detail with reference to the following drawings and description. The components in the figures are not necessarily to scale, emphasis instead being placed upon illustrating principles of the invention. Moreover, in the figures, like reference numerals designate corresponding similar parts or elements throughout the different views.

Aspects of the present disclosure relate to an amplifier or gain circuit with offset cancellation which corrects for an undesired offset that may occur in differential amplifiers (or other amplifier circuits). The signal output from a differential amplifier may be low-pass filtered to resolve a low-frequency (and/or D.C.) offset component. The filtered D.C. component may then be used as a control to an offset cancellation circuit of the differential amplifier. A feedback path in the form of offset calibration loops may be used to minimize the impact of the offset by introducing the filtered offset in the opposite direction along the base signal path so that the offset is cancelled according to the filtered offset signal.

FIG. 1 illustrates a feedback circuit according to one embodiment. In particular, FIG. 1 illustrates an operational transconductance amplifier (OTA) feedback circuit 100. An OTA's function is primarily to deliver an amplified current in response to an input voltage. An OTA is, thus, a voltage controlled current source. However, an operational transconductance amplifier should not be confused with a standard operational amplifier, whose primary function is the amplification of an input voltage to a large output voltage.

Nonetheless, as illustrated in FIG. 1, the feedback circuit may include an amplifier stage 110, a feedback amplifier 120, and a low-pass filter 130. While FIG. 1 illustrates the amplifier stage 110 graphically using an amplifier symbol, it should be understood that the amplifier stage 110 may be a single amplifier or a chain of amplifiers, as will be discussed in more depth later with regard to FIGS. 2A and 2B.

Referring back to FIG. 1, a voltage, $v_{in}$, is applied to an input of the amplifier stage 110. An amplifier stage may also be used herein as an amplifier circuit or gain circuit. A voltage, $v_{out}$, is received at the output of the amplifier stage 110 in response to applying a voltage $v_{in}$ to the amplifier stage's input. The amplifier stage 110 accordingly provides voltage and current gains of the amplifier stage 110 $A_V$ and $A_I$, respectively, relative to the input provided to the amplifier stage 110 such that $v_{out}=A_v v_{in}$ and $i_{out}=A_i i_{in}$.

The output of amplifier stage 110 may be connected to a load (not shown). In addition, the output of amplifier stage 110 may be fed into a feedback amplifier stage 120. The gain of the feedback amplifier stage 120 may be a buffer stage configured to exhibit a gain of one or less, so that the input into the feedback amplifier stage 120 is amplified with unity gain (or less).

Resistor $R_{out}$ and capacitor $C_{out}$ form the low-pass filter 130 as illustrated in FIG. 1, according to one embodiment. The low-pass filter 130 has a cutoff frequency that is the inverse product of the resistance and capacitance $$\left(\omega_{op} = \frac{1}{R_{out} * C_{out}}\right).$$

It should be understood that any other type of low-pass filter may be employed, and the present invention need not be limited to the explicitly-disclosed embodiment of FIG. 1. Regardless, the output of the filter has voltage $V_F$ and is fed back into the input of amplifier stage 110.

Although FIG. 1 portrays the feedback amplifier stage 120 as preceding the low-pass filter 130 on the signal path and the amplifier stage 110 as a single amplifier, the present invention should not be limited to such configuration. In this regard, as discussed below and illustrated with regard to FIGS. 2A, 2B, and 3, the amplifier stage 110 may be a cascade of amplifiers and the low-pass filter 130 may precede the feedback amplifier stage 120.

Figure 2A:
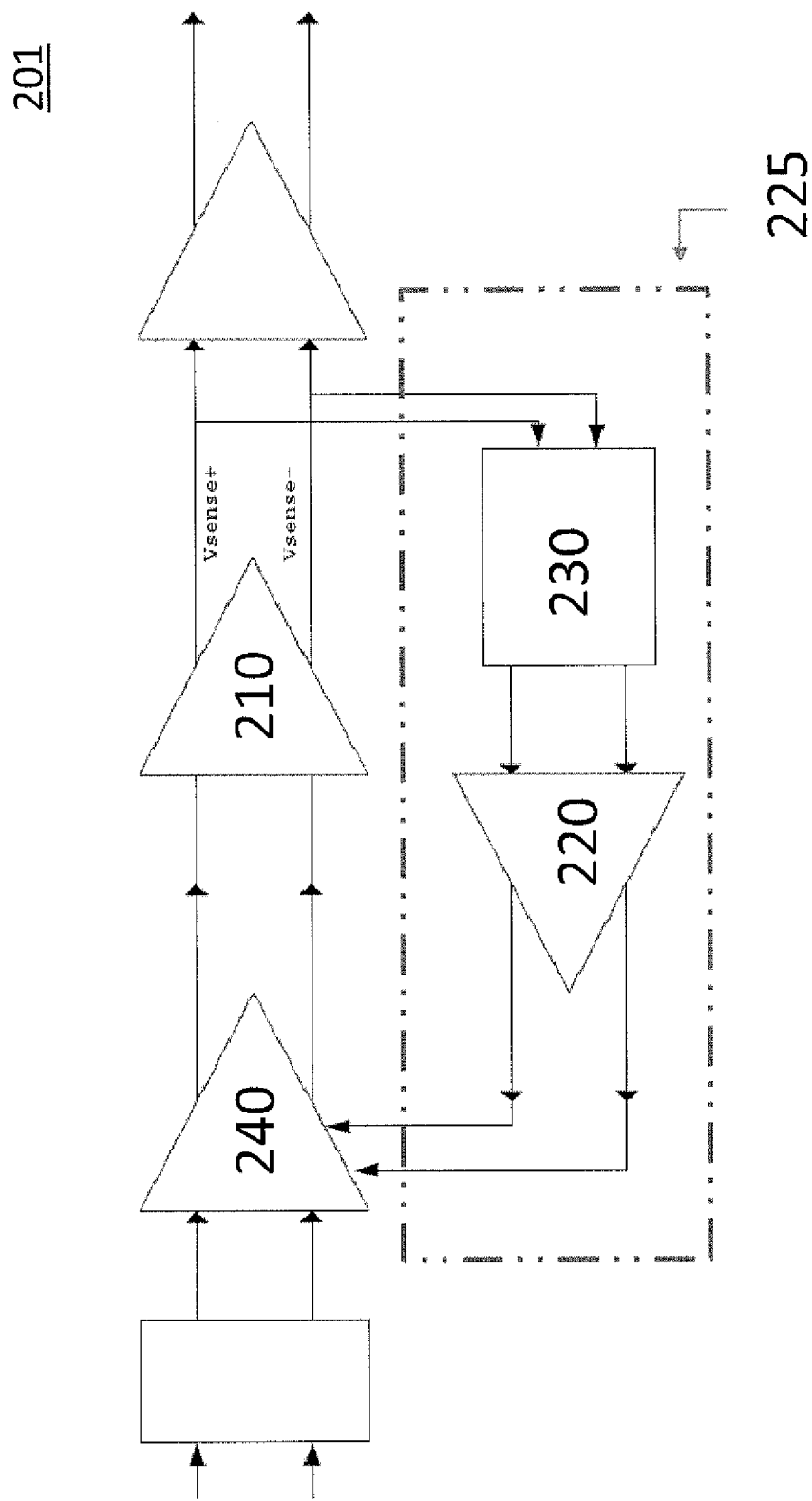
FIG. 2A illustrates a circuit system including an amplifier chain and a feedback path according to one embodiment.
Figure 2B:
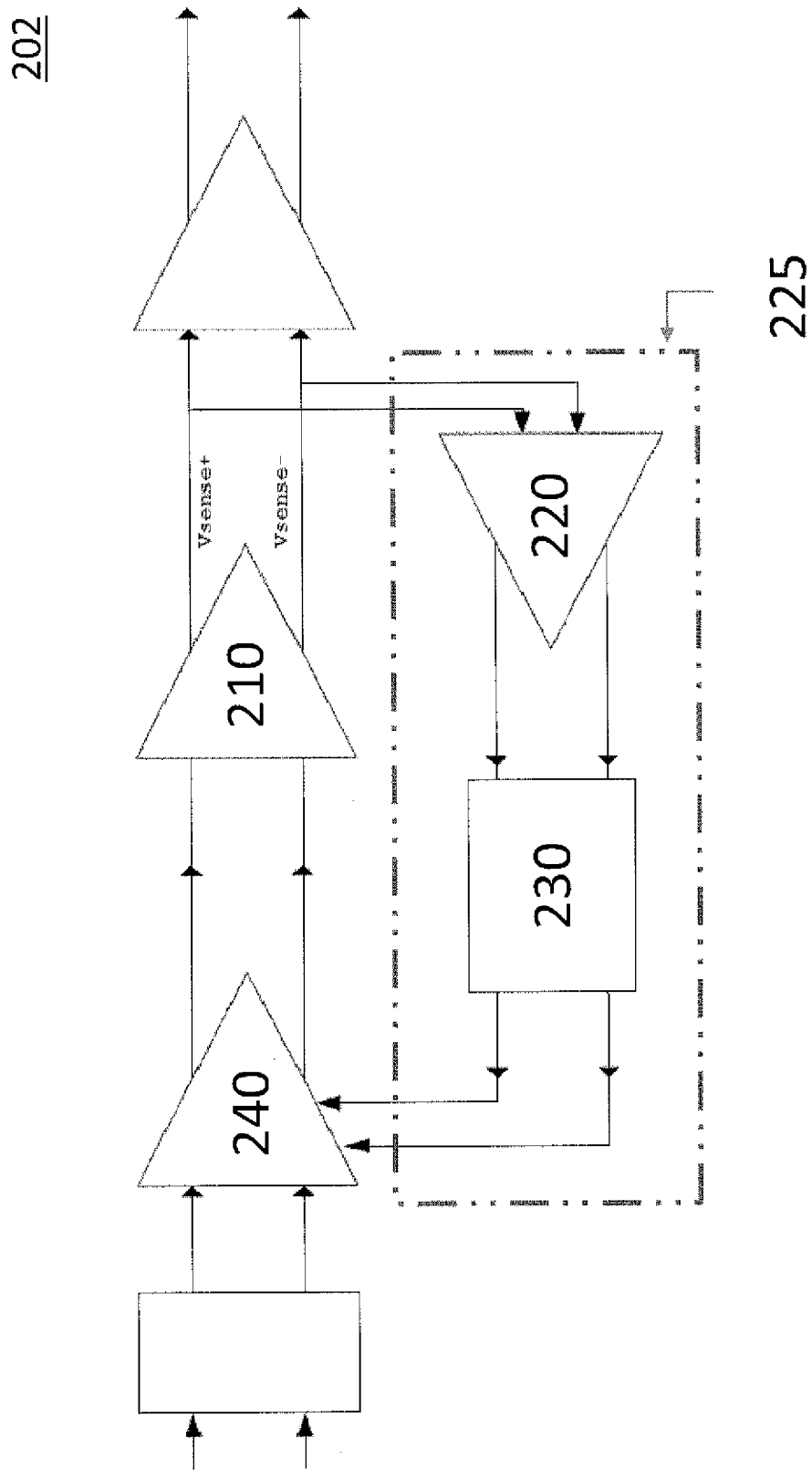
FIG. 2B illustrates another circuit system including an amplifier chain and a feedback path according to another embodiment.

FIGS. 2A and 2B illustrate implementations of circuit systems 201 and 202 which simultaneously provide for offset cancellation and gain according to some embodiments. As illustrated FIGS. 2A and 2B, the signal amplifier stage (110 of FIG. 1) in the receiver path is implemented as a cascade of a gain or equalizer stage 240 and one or more gain stages 210 connected with the output of the gain/equalizer stage 240. Although FIG. 2A illustrates a single gain stage 210 connected to gain/equalizer stage 240, two or more gain stages 210 may be serially connected together so that the first of the gain stages 210 is connected to the output of gain/equalizer stage 240 and the output of at the last gain stage 210 is connected to the input of the feedback path 225. It should be understood that the terms "gain stage" and "gain circuit" may be used interchangeably herein.

FIG. 2A illustrates an offset calibration path implemented by the feedback path 225. The feedback path 225 may include a low-pass filter 230 and a feedback amplifier stage 220. In the embodiment of FIG. 2A, the low-pass filter 230 loads the high-speed or base signal (from gain stage 210) and also may feed the input of the feedback amplifier stage 220. The feedback amplifier stage 220 then feeds the beginning of the cascade of gain stages (e.g., gain stage 240) providing feedforward loop gain. It should be noted that, in some embodiments, this configuration may lead to an increase in device noise and an associated loss in bandwidth of the signal due to the added components in the gain or equalizer stage 240 necessary to process the feedback signal. Nonetheless, such a configuration also provides offset cancellation, as discussed below.

The input of the low-pass filter 230 may (at least initially) be both the base signal and a low-frequency or DC offset received from gain stage 210. The low-pass filter filters the base signal out from the low-frequency or D.C. offset component so that the output of the low-pass filter 230 is substantially only the low-frequency or D.C. offset. The low-pass filter 230 may have a cutoff frequency that is significantly less than the operational frequency of the base signal (which can essentially be an RF signal), for example, less than or equal to $\frac{1}{100}$ of the lowest resolved signal frequency so that the base signal is filtered out with minimal inclusion of RF signal components. In one embodiment, the low-pass filter 230 may involve resistances, R, of about 100 kΩ and capacitances, C, of about ten (10) pF. The low-pass filter may have a resulting cutoff frequency between 1 MHz and 100 MHz. In such exemplary embodiment, a resistance of 100 kΩ and capacitance of ten (10) pF would result in a cutoff frequency of 1 MHz. If the high-speed signal has a signal frequency of about 10 GHz, the low-pass filter 230 in the above example then substantially filters the signal out from the offset component, since all signal above 1 MHz, including the 10 GHz high-speed signal, is filtered, leaving only the offset component as the output of the low-pass filter 230.

The output of the low-pass filter 230 is then returned to the amplifier stage 240 as an offset correction. In one embodiment, the low-frequency/DC-only component is transmitted as the feedback correction signal to the offset cancelling circuit, as will be discussed more later with regard to FIGS. 5, 6 and 8. The result of applying the feedback correction signal to the offset cancelling circuit allows the output of the amplifier stage 240 to have no offset in some embodiments. It should be noted that the offset is corrected almost instantaneously so that at time zero, an offset may occur but is immediately corrected by the offset correction circuit. As such, the offset may only occur initially in the circuit as it is immediately cancelled by the offset cancelling circuit.

It should be understood that the feedback path 225 may occur for any number of amplifier stages, and thus, should not be limited to a single amplifier stage (such as stage 210 in the example of FIG. 2A). For example, amplifier stage 210 may be replaced with multiple cascading amplifier stages. In another example, multiple feedback loops 225 may be employed in a cascade of amplifier stages so that the offset of each gain stage in the base signal path is compensated. It should further be noted that feedback loop 225 may include additional components or less components than is discussed and illustrated herein, and as such, the present invention is not be limited to those embodiments that are explicitly discussed herein. While some embodiments are explicitly described and illustrated herein, it should be known that many other configurations are possible whereby the feedback loop 225 can be applied to compensate for offset of one or more amplifier stages.

Additionally, as mentioned above, a gain stage 220 may be connected to the output of low-pass filter 230, as illustrated in FIG. 2A. The gain stage 220 may act as a buffer between the low-pass filter 230 and the input of the equalizer or gain stage 240. In this regard, the gain of gain stage 220 may be equal to one.

It should be understood that the ordering of the components (e.g., the low-pass filter 230 and gain stage 220) in the feedback loop 225 may be varying. In this regard, as illustrated by the embodiment of FIG. 2B, the feedback gain stage 220 may be connected to the input of the low-pass filter 230 (instead of to the output of the low-pass filter 230). As previously noted, noise may be introduced by the additional components (e.g., components as illustrated in FIGS. 2A and 2B) to the gain or equalizer stage 240 required to process the feedback signal. Such noise may be mitigated by feeding the base high-speed signals to device(s) that are not directly in the signal path, such as the feedback amplifier stage 220 as shown in FIG. 2B, prior to providing these signals to the low-pass filter 230. In this circumstance, the low-pass filter 230 may desirably perform a dual function, both isolating the low-frequency (DC) offset signal and removing the noise introduced by the additional components to gain or equalizer stage 240. Thus, in FIG. 2B, noise from gain stage 220 may be filtered by, for example, low-pass filter 230 in the feedback path 225 connected to the output of feedback gain stage 220. FIG. 2B is also an example of a configuration lending itself to bandwidth compensation, because by loading the signal path with the amplifier stage 220 instead of the low-pass filter 230 (as shown in FIG. 2A), a lower capacitive load is presented to the signal path. Reducing or eliminating "RC loading" may increase the operational bandwidth, since a smaller RC constant in $$\omega_{op} = \frac{1}{R_{out} * C_{out}}$$

implies a higher cutoff frequency ($\omega_{op}$) and thus increased bandwidth.

It should be understood that gain stage 220 need not be a part of feedback loop 225 since such gain stage 220 may act primarily as a buffer. As such, feedback loop 225 without gain stage 220 may still function as intended to cancel the offset of the input signal to gain stage 240.

Some aspects of the disclosure involve configurations of transistors that could comprise a combined equalization and gain stage 240, including configurations resulting in enhanced bandwidth and/or further enhanced gain to the equalizer/amplifier stage 240.

The feedback path 225 of circuit systems 201 and 202 may be implemented in either an analog or a digital fashion. Likewise, the feedback signal to the equalizer or gain stage 240 can be in the form of an analog voltage or current, or in the form of a digital output from a digital state machine. FIG. 3 depicts the alternative implementations of the feedback path 225. The digital solutions 302 and 304 illustrated in FIG. 3 each may require a clock input $CK_{in}$.

Figure 3A:
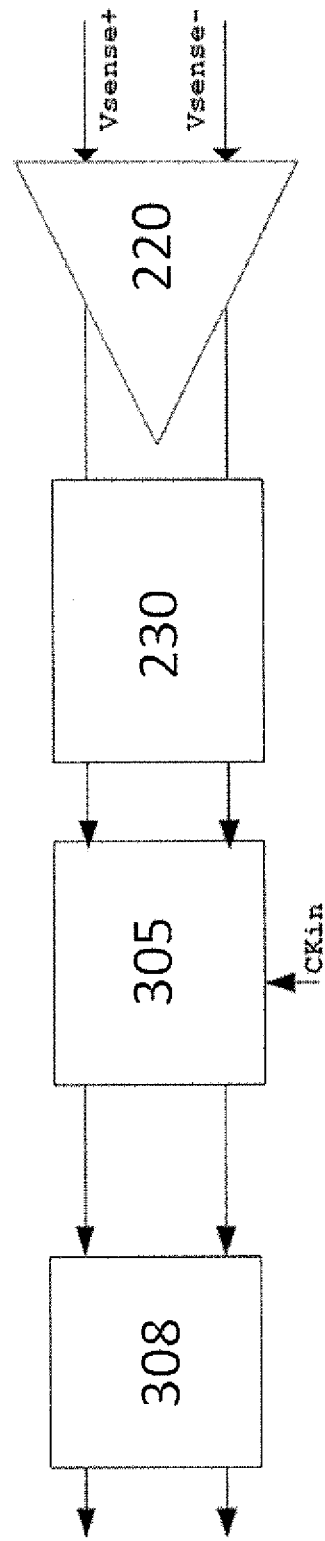
FIGS. 3A-B illustrate exemplary feedback paths that could be implemented into FIG. 2A or 2B according to some embodiments.

As illustrated in feedback path 302 of FIG. 3A, the feedback gain stage 220 receives the high-speed signal from the gain stage 210 in the signal path. The low pass-filter 230 is connected to the output of the feedback gain stage 220. A high sensitivity comparator and digital state machine 305 ("comparator 305") is connected to the output of the low-pass filter 230. The comparator 305 receives a clock signal $CK_{in}$. The output of the comparator 305 is a digitized offset correction signal which is then fed into a digital-to-analog conversion circuit (DAC) 308. The output of the DAC 308 is an analog offset cancellation signal which is then fed back into the equalizer/gain stage 240, as previously described with regard to FIG. 2A.

Figure 3B:
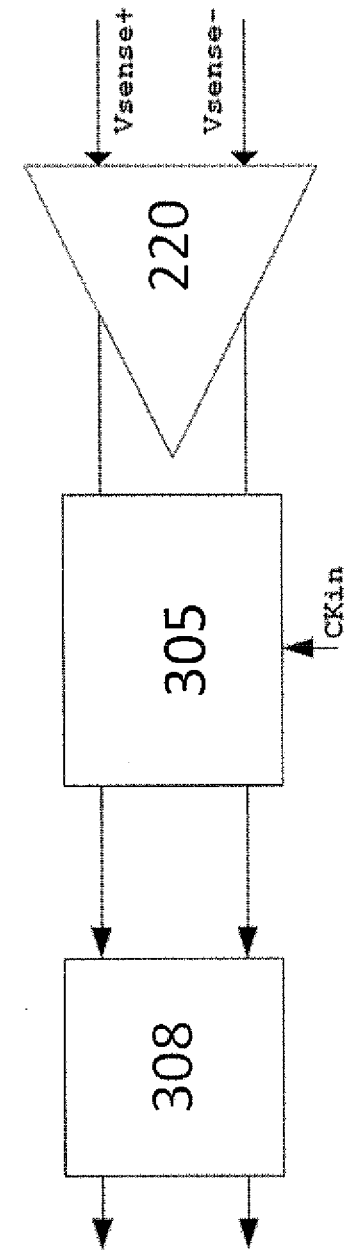

FIG. 3B also illustrates another embodiment circuit 304 of the feedback loop 225 with digital components. Similar to the previously-described digital circuit 302, circuit 304 begins with the feedback gain stage 220 receiving the high-speed signal (with the undesired offset. The output of the feedback gain stage 220 is then provided to the comparator 305 and DAC 308 which are described above. In this implementation, it is shown that the low-pass filter 230 is omitted and thus, not needed. In this regard, the comparator 305 and DAC 308 of circuit 304 output the offset correction signal back into the equalizer/gain stage 240 as an analog offset cancellation signal.

It should be understood that the offset correction signal may be an offset of voltage and/or current. As such, the feedback loop 225 would output the offset voltage or offset current to compensate for the respective offset in the high-speed signal in the signal path.

Figure 4A:
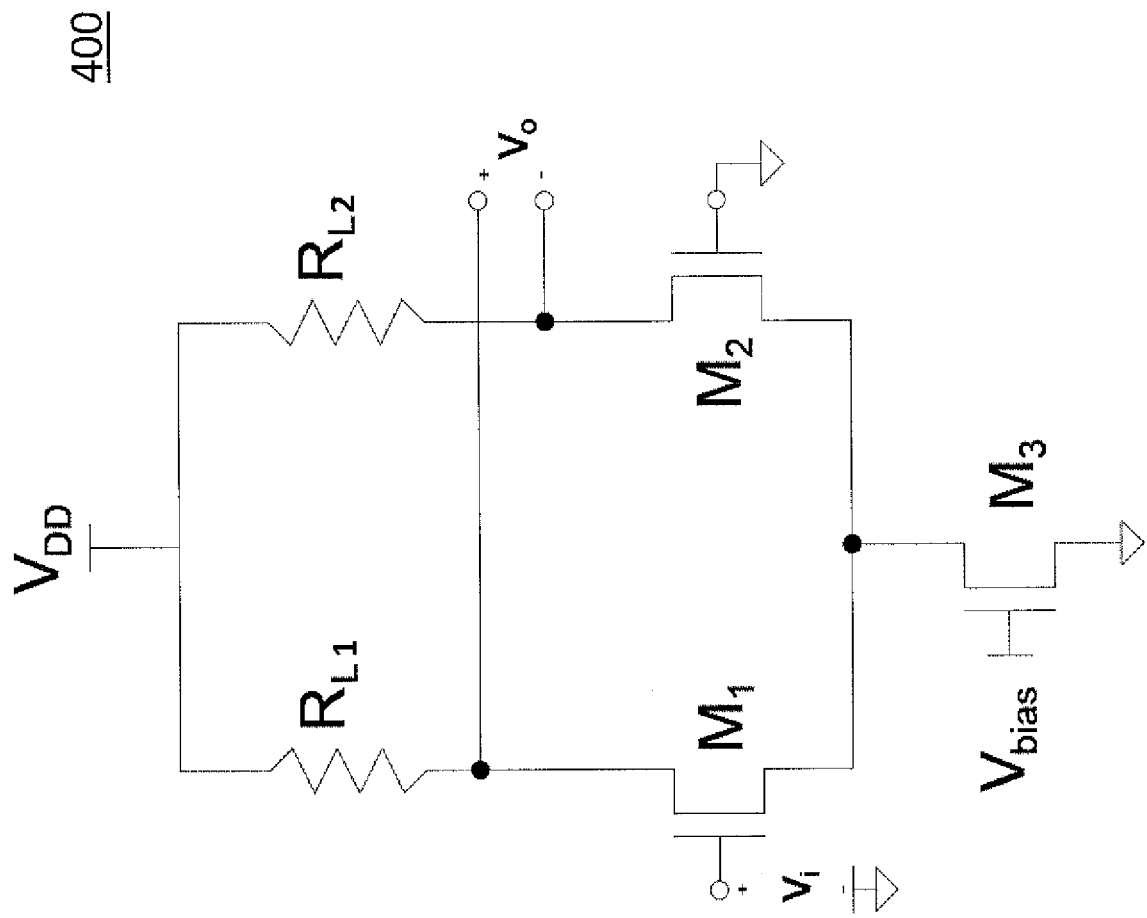
FIG. 4A illustrates a circuit including a transistor differential pair according to one embodiment.
Figure 4B:
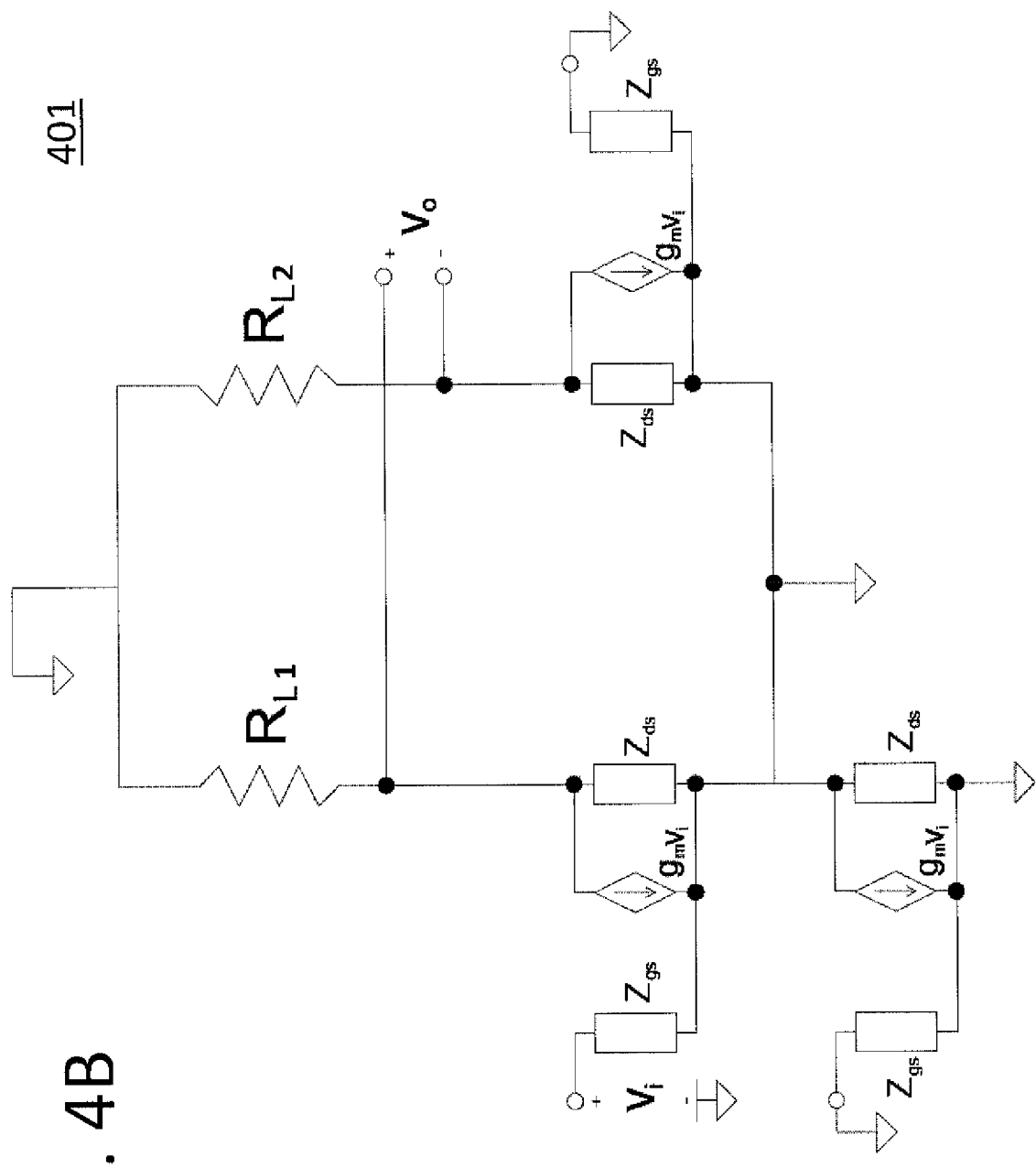
FIGS. 4B-4C illustrate equivalent circuits of the circuit of FIG. 4A.
Figure 4C:
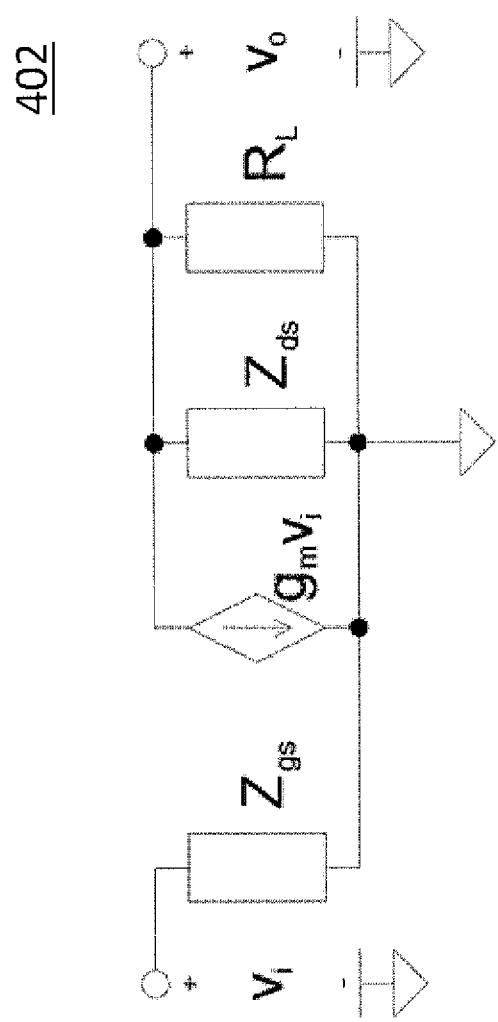

FIGS. 4A-4C depict an uncompensated MOSFET differential pair (e.g., a differential pair without any offset signal compensation). The differential pair 400 (FIG. 4A) may be at least a portion of the equalizer/gain stage 240 and, as such, is the base portion of the circuits shown in the embodiments of FIGS. 5A, 6A and 9A, which are discussed later. In FIG. 4A, the input voltage, $v_i$, is applied between the inverting and non-inverting terminal inputs at the gates of MOSFETs $M_1$ and $M_2$, respectively. The DC bias is provided by a constant voltage source $V_{DD}$. A bias tail current is maintained by a second constant voltage source $V_{bias}$ applied to the gate of MOSFET $M_3$. MOSFET $M_3$ acts as a current sink to the differential pair 400. The signal $v_i$ may be equivalently represented as having one node being applied to a single terminal (e.g., the input gate of $M_1$) with the second node being grounded as illustrated, or may be alternatively represented as positive and negative half-voltage signals ½ $v_i$ and −½ $v_i$ applied to each terminal. The output $v_o$ is taken as the difference between the signals at the drains of $M_1$ and $M_2$ ($v_{D,M1} - v_{D,M2}$). The output of $v_o$ is the output of the equalizer/gain stage 240. The result of the circuit 400 of FIG. 4A is that the output voltage $v_o$ is increased by a gain factor relative to the input voltage $v_i$.

FIG. 4B illustrates the small signal model 401 of the differential pair circuit 400, which represents the transistor currents, transistor impedances, and external impedances (namely $R_L$ and short circuits at the DC bias supplies) as seen by a small, high-frequency signal propagating in the differential pair 400/401/402. The FETs are represented as having gate-source and drain-source impedances $Z_{gs}$, $Z_{ds}$. The FET current is modeled as a voltage-controlled current source (VCCS) with FET drain-source current $i_{ds}=g_m v_{gs}$, where $g_m$ is the FET transconductance. $Z_{gs}$ often represents the "Miller effect" capacitance of the transistor with $$Z_{gs} = \frac{1}{s*C_M},$$

and $Z_{ds}$ is often assumed to be real-infinite, zero-complex (open circuit output impedance, no reactance). However, neither assumption is made in the following analysis.

Assuming complete differential symmetry (i.e., well matched FET's), a virtual ground exists in the center plane of circuit 400 that keeps current from flowing into the tail at frequencies above DC. Accordingly, a (small-signal) short circuit may be placed between $M_1$, $M_2$ in circuit 401 of FIG. 4B, effectively shorting out FET $M_3$ in the high-frequency domain. The entire small-signal model may be re-drawn as the simplified circuit 402 of FIG. 4C.

From FIG. 4C, it is possible to symbolically calculate the circuit parameters of the differential pair, such as the output voltage $v_o$ and output current $i_o$ resulting from an input voltage $v_i$ and current $i_i$. The parameters of the differential pair can be calculated in Table 1 as follows:

TABLE 1

FIG 4A-4C UNCOMPENSATED DIFFERENTIAL PAIR PARAMETERS

| | |
|---|---|
| (a) | $v_{in} = v_i$ |
| (b) | $i_{in} = i_i = \dfrac{v_i}{Z_{gs}}$ |
| (c) | $g_m = \sqrt{2\mu_n C_{OX}\left(\dfrac{W}{L}\right)I_D}$ (MOS transconductance) |
| (d) | $v_{out} = v_o$<br>$= -g_m * v_i * (Z_{ds} \| R_L)$<br>$= -g_m * v_i * \left(\dfrac{Z_{ds} * R_L}{Z_{ds} + R_L}\right)$ |
| (e) | Gain $(\|A_V\|) = \left\|\dfrac{v_o}{v_i}\right\|$<br>$= g_m * (Z_{ds} \| R_L)$<br>$= g_m * \left(\dfrac{Z_{ds} * R_L}{Z_{ds} + R_L}\right)$ |
| (f) | Gain $(\|A_r\|) = \left\|\dfrac{i_o}{i_i}\right\|$<br>$= \dfrac{g_m * v_i}{\dfrac{v_i}{Z_{gs}}}$<br>$= g_m Z_{gs}$ |

In Table 1, $g_m$ represents the MOSFET transconductance, which is proportional to the square root of the drain current ID (equation (c)). Although the current gain appears high ($Z_{gs}$ is often taken to be infinite-real zero-complex, which implies infinite current gain), this is only because the input current $i_{in}$ for a MOSFET is about zero and not because the differential pair is delivering a substantial output current. In contrast, the voltage gain is ~$R_L$ ($Z_{ds}$ is also often taken to be infinite-real zero-complex), and so the bare differential pair is primarily a voltage gain circuit, requiring an additional current source/sink to make it an operational transconductance (current amplifying) circuit.

If the circuit suffers from low-frequency offset, it will be present as a constant or slowly varying voltage or current offset term, e.g., $i_o^+ - i_o^-$ or $v_o^+ - v_o^-$ equal to some constant (or slowly varying) value as measured from the output nodes. As stated above, a further simplification that is often made for ideal FETs is $Z_{ds} = \infty + 0j$ (i.e., infinite output impedance with no reactive components, including inductance or capacitance).

Figure 5A:
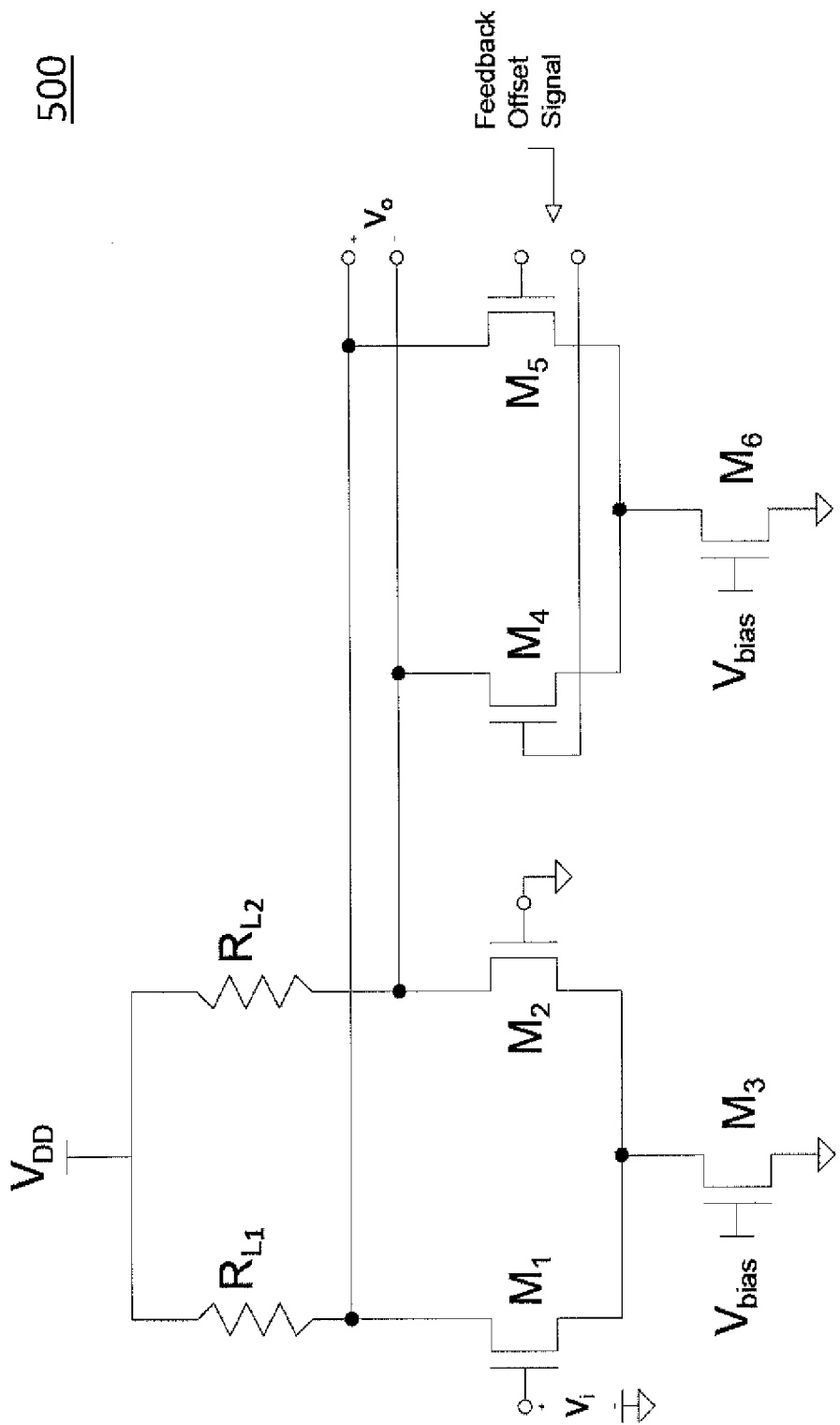
FIG. 5A illustrates a gain circuit having a transistor differential pair and an offset cancellation circuit according to one embodiment.
Figure 5B:
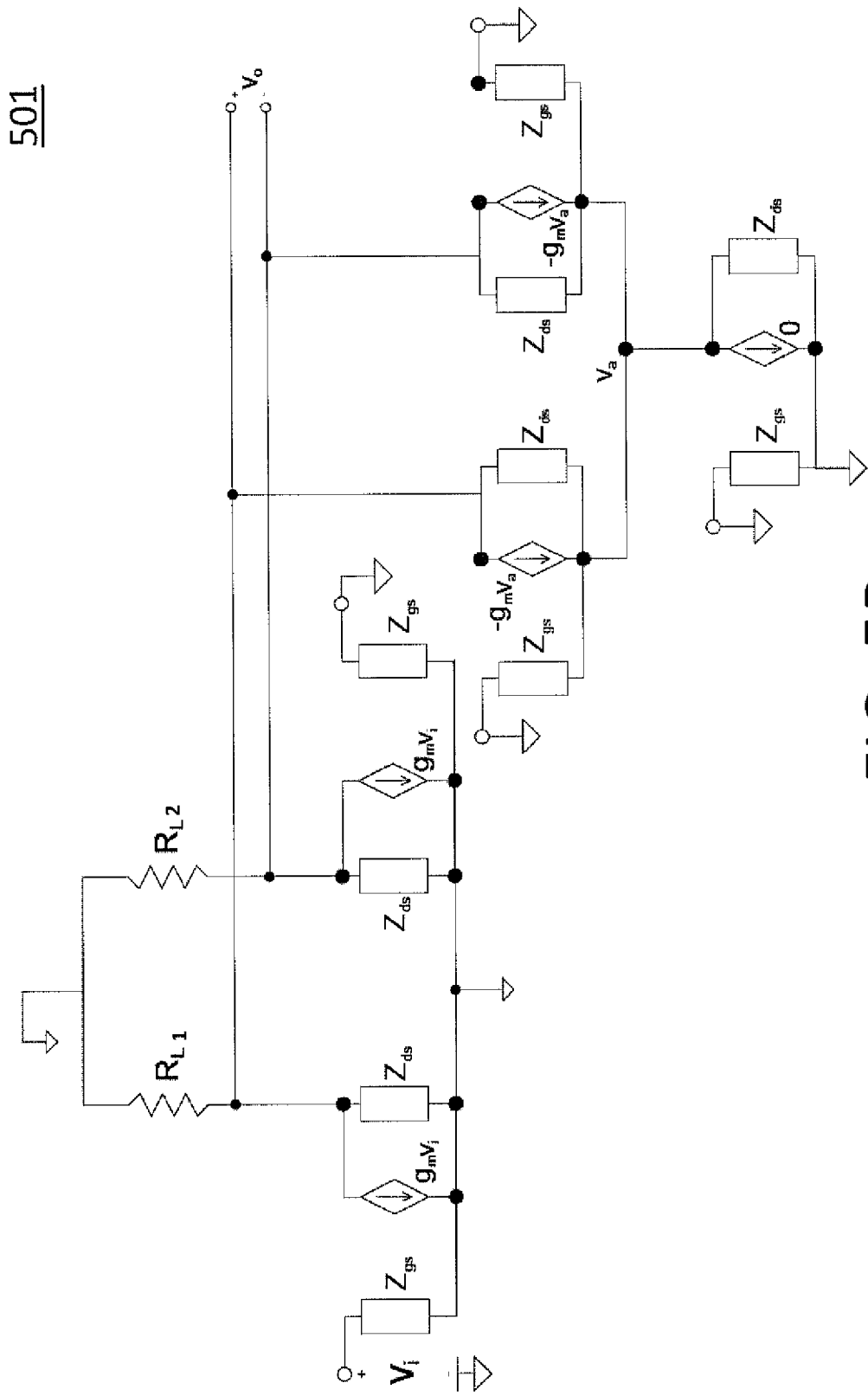
FIGS. 5B-5C illustrate equivalent circuits of the circuit of FIG. 5A.
Figure 5C:
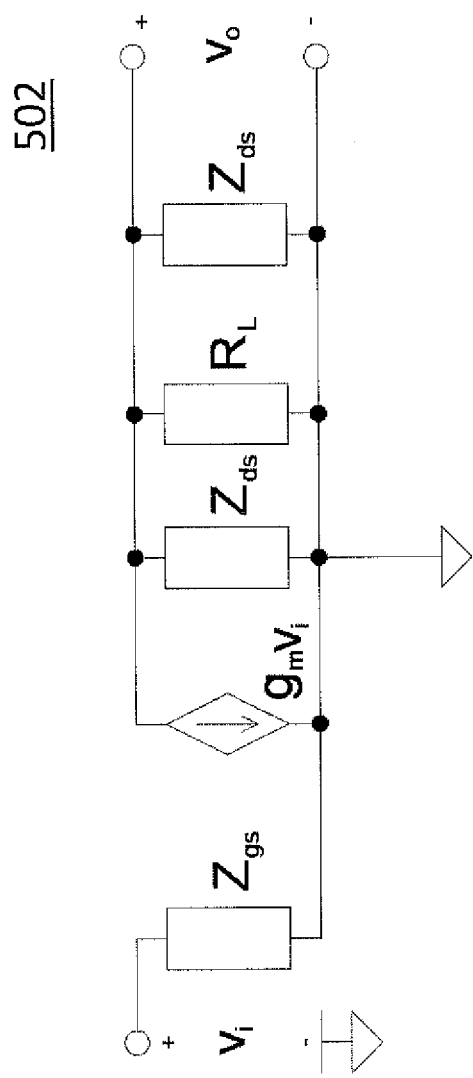

FIGS. 5A-5C represent a differential pair with an offset cancellation, but without any current or bandwidth boosting capabilities. It should be noted that the offset-compensated differential pair stage of FIG. 5A could act as the gain or equalizer stage 240.

Qualitatively, in the circuit schematic of FIG. 5A, an offset signal in the output $v_o$ would pass from the output of the circuit 500, along with the desired signal through gain stage(s) 210 in the signal path and into the feedback loop 225, including amplifier stage 220 and low-pass filter 230, as previously described with regard to FIGS. 2A-2B. Regardless of the configuration (e.g., FIG. 2A or FIG. 2B), the offset appears as a constant or slowly-varying potential to one of the offset feedback FET gates (either $M_4$ or $M_5$) relative to the other. For example, if the offset were a positive DC voltage of 100 mV at the output (drain) of $M_2$, the 100 mV offset would return to $M_4$, $M_5$ (without a signal component), and cause $M_4$ to act as a bias-proportional current sink. This, in turn, causes an increase in current in the $M_2$ differential pair branch and thus, a higher current over the resistor $R_{L2}$. By increasing the current through the resistor $R_{L2}$, a larger voltage drop appears across the resistor $R_{L2}$ in the $M_2$ branch (e.g., say 100 mV more of a drop), resulting in the elimination of the excess 100 mV low-frequency offset at the drain of $M_2$. In this way, the offset compensation branch dynamically adjusts the operating points of each circuit component to maintain a balanced differential signal output devoid of low-frequency offset.

It should be understood that $R_{L1}$ and $R_{L2}$ may be referred to herein as $R_L$ and thus, may have the same resistance value in some embodiments.

A similar operation occurs in the $M_1$ differential pair branch. If an offset on the $M_1$ differential pair branch occurs, a bias on the gate of MOSFET $M_5$ causes an increase in conductivity, and thus increases the current therethrough. As a result, current is increased through the resistor $R_{L1}$ in the $M_1$ branch, which will produce a larger voltage drop from the biased voltage $V_{DD}$. Accordingly, the voltage at one of the output nodes is lowered proportionately below the biased voltage $V_{DD}$ by the voltage drop. Since this voltage at the one output node will be lower than that at the other output node, this effectively compensates for the offset, thereby cancelling it.

FIG. 5B illustrates the small-signal model 501 of the basic offset compensation circuit 500. Although there is again a differential symmetry that makes it possible to draw virtual short circuits through the central planes of both the differential pair and the offset compensation circuit, it is also clear that FETs $M_4$, $M_5$ do not contribute any signal voltages or currents to the output $v_o$, since $v_{gs}$ in either case is zero. Either consideration leads to an effective shorting out of the tail bias FETs $M_3$ and $M_6$, resulting in signal voltage $v_a$ equaling zero in FIG. 5B. Accordingly, the offset compensation circuit may generally perform no active signal processing (neither adds nor removes signal currents or voltages from the circuit) in the assumption that $Z_{ds}$ is infinite and without reactance. This is equivalent to the observation that circuit 500 does not enhance the gain or bandwidth of the bare differential pair 400.

However, since $Z_{ds}$ has not been assumed to be infinite and without reactance in this analysis, and the offset compensation circuit does add a (second) parallel impedance $Z_{ds}$ at the output, resulting in an overall lower voltage gain for the circuit as evidenced from Table 2 below. Notably, this does not impact the MOS transconductance $g_m$ (since drain current $I_D$ is unchanged) nor the current gain. The above conclusions and assumptions result in the circuit parameters given in Table 2, and may be derived from the further simplified small-signal model depicted in FIG. 5C.

TABLE 2

FIG 5A-5C OFFSET COMPENSATED DIFFERENTIAL PAIR PARAMETERS (NO CURRENT OR BANDWIDTH ENHANCEMENT)

(a) $v_{in} = v_i$ (b) $i_{in} = i_i = \dfrac{v_i}{Z_{gs}}$ (c) $g_m = \sqrt{2\mu_n C_{OX}\left(\dfrac{W}{L}\right)I_D}$ (MOS transconductance)

Figure 6A:
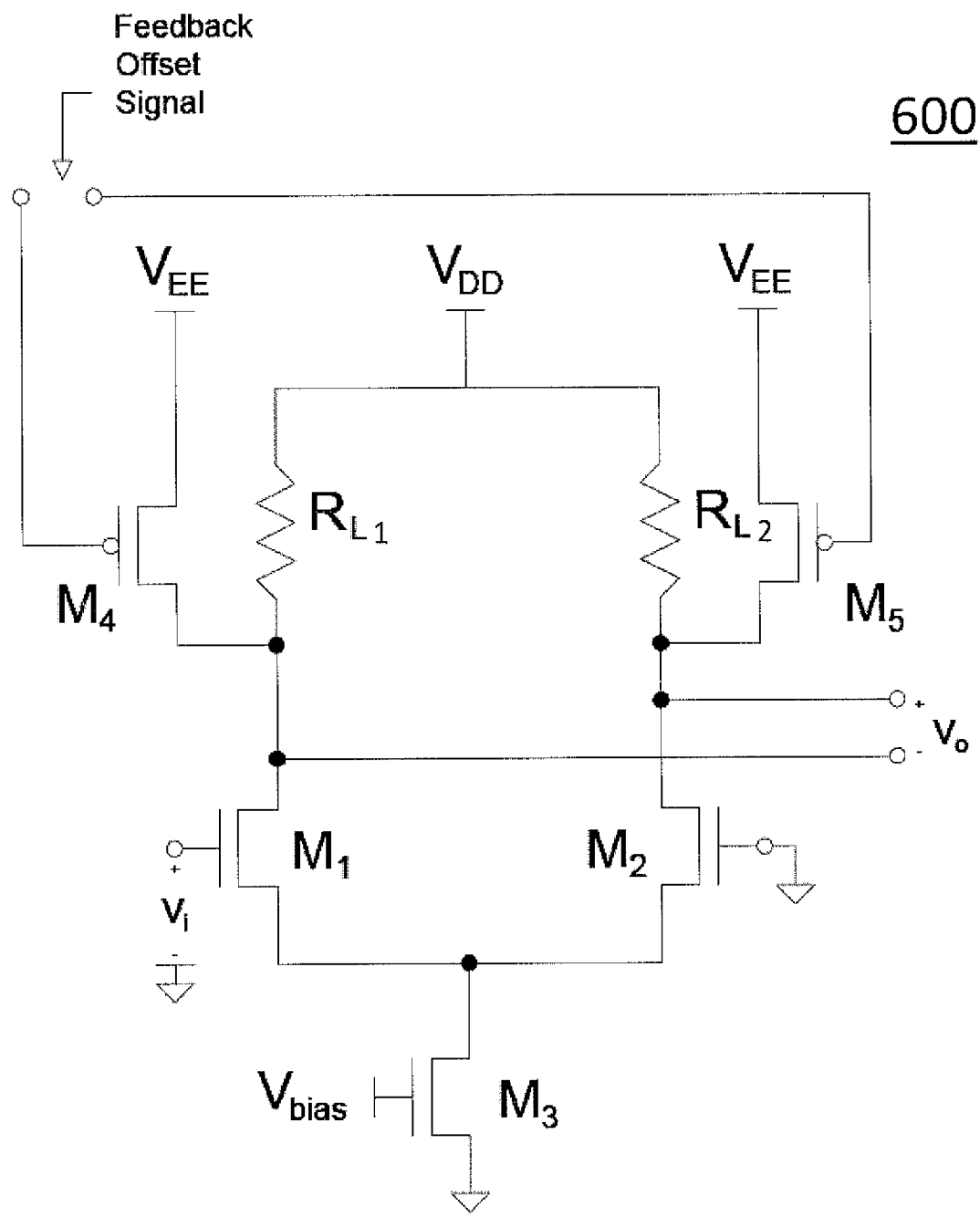
FIG. 6A illustrates a gain circuit having a transistor differential pair and an offset cancellation circuit according to another embodiment.
Figure 6B:
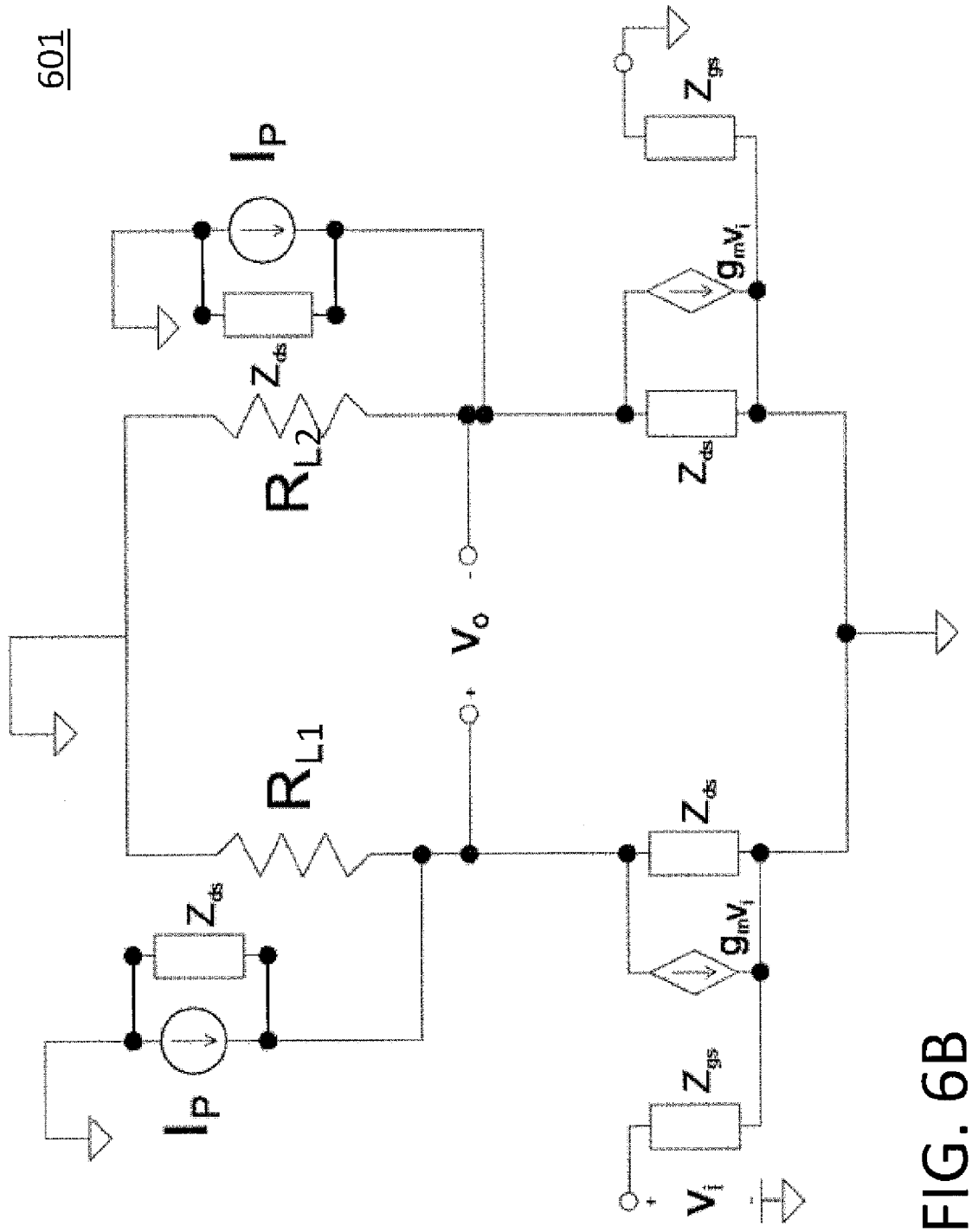
FIGS. 6B-6C illustrate equivalent circuits of the circuit of FIG. 6A.
Figure 6C:
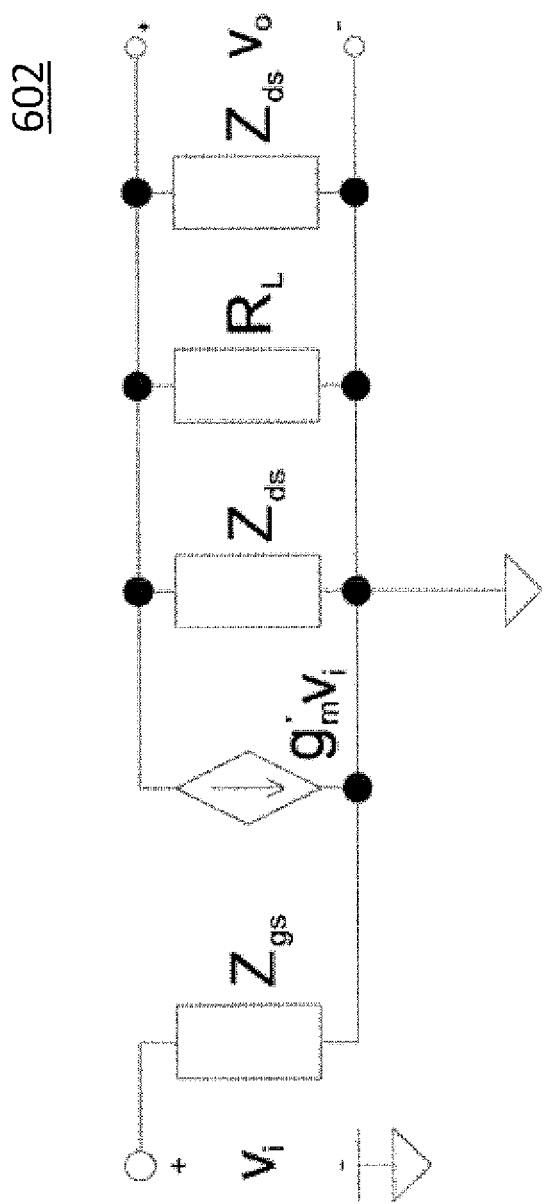
Figure 7A:
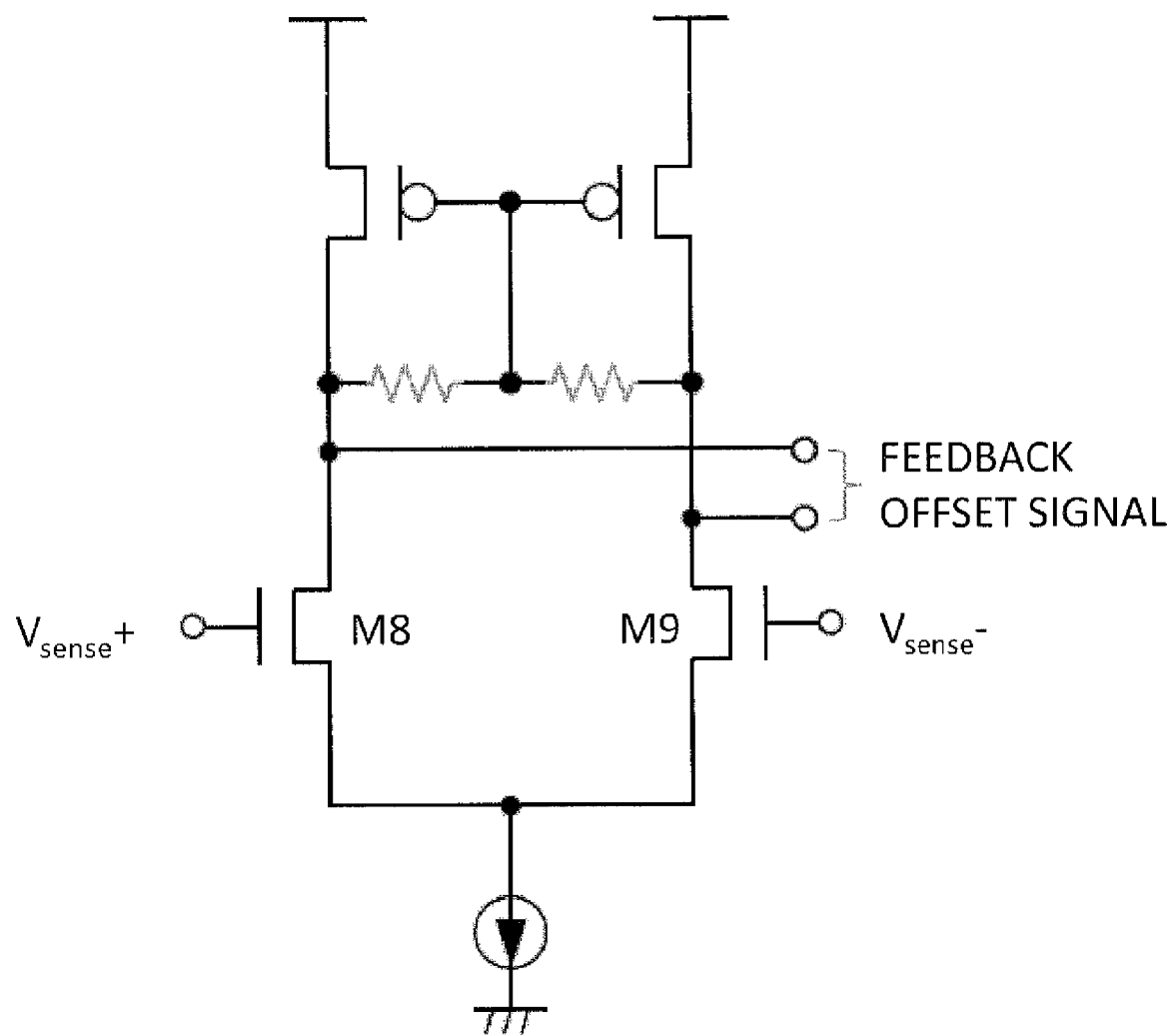
FIGS. 7A-D illustrate exemplary circuits for the feedback amplifier for the circuit of FIG. 2A according to some embodiments.
Figure 7B:
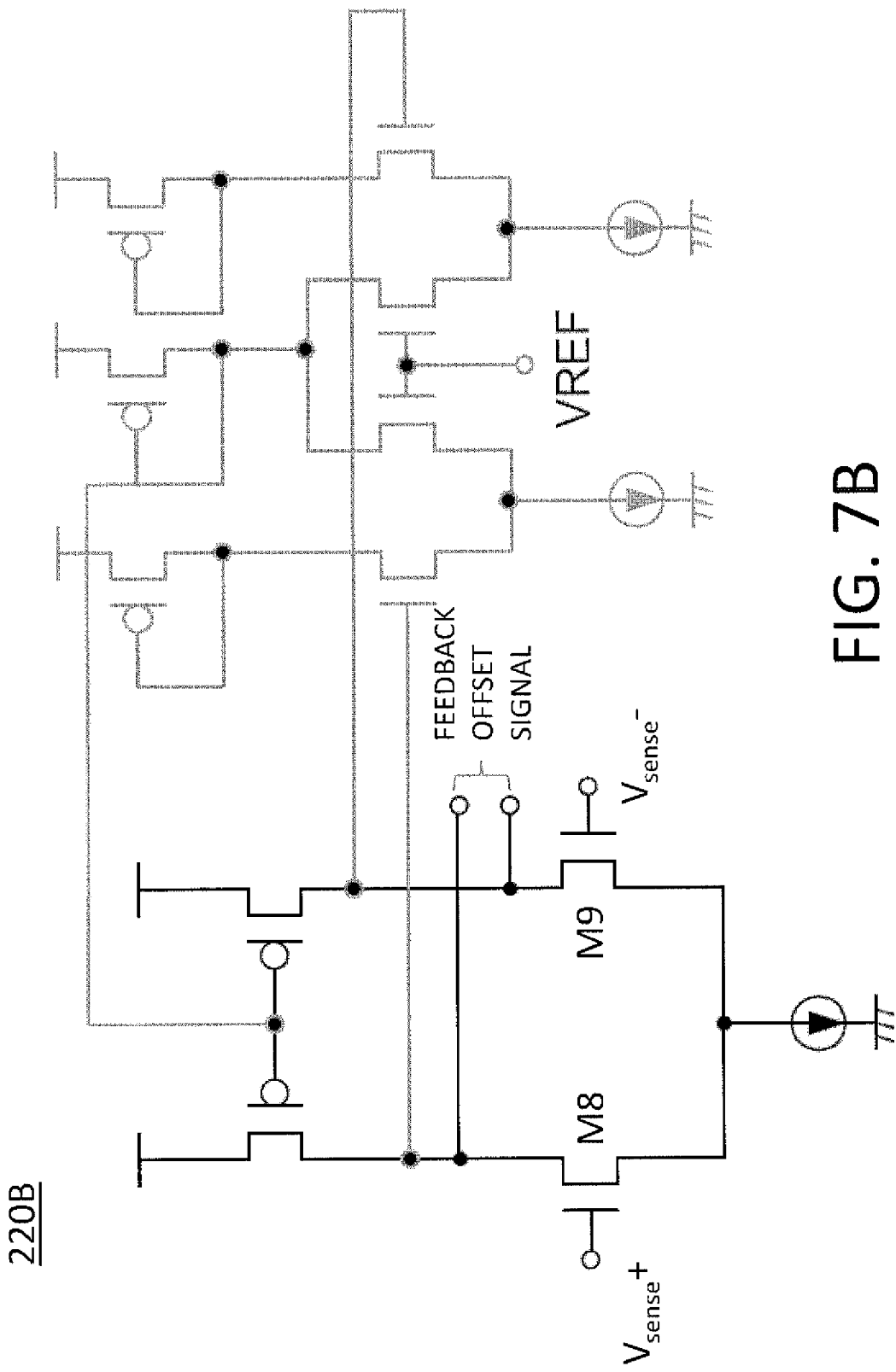
Figure 7C:
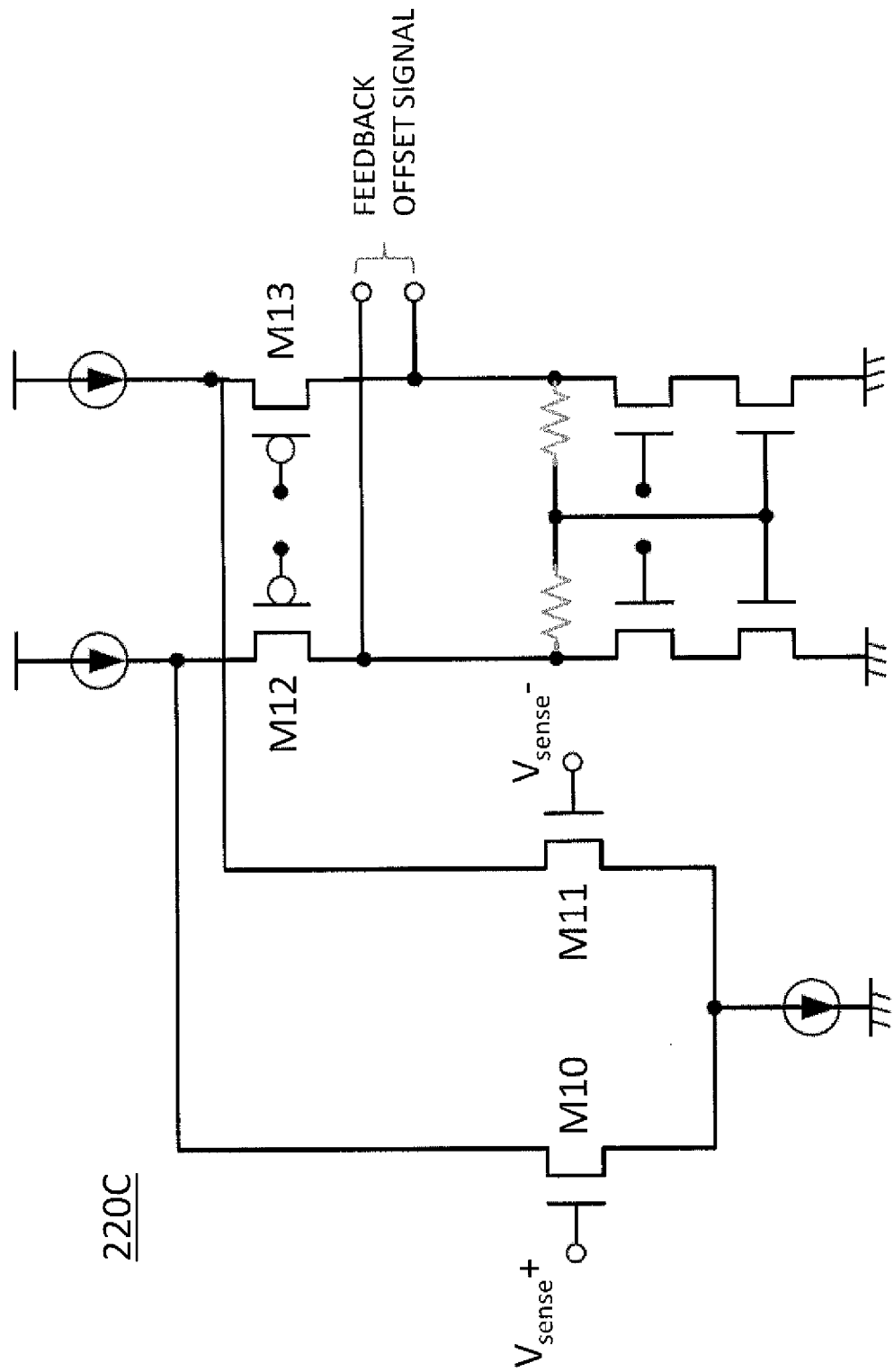
Figure 7D:
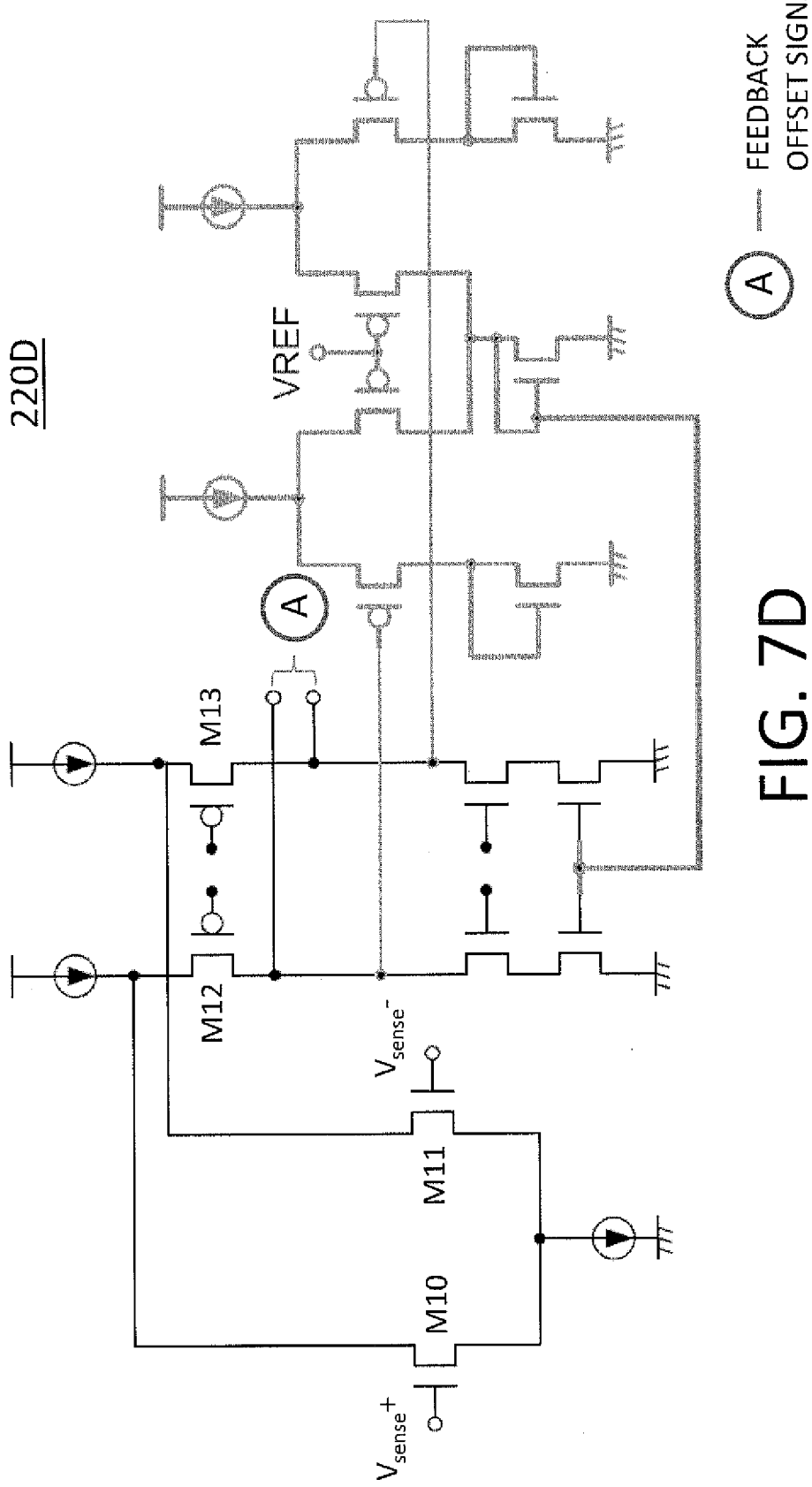

(d) $v_{out} = v_o$
$= -g_m * v_i * (Z_{ds} \| Z_{ds} \| R_L)$
$= -g_m * v_i * \left(\dfrac{Z_{ds}}{2} \| R_L\right)$
$= \dfrac{-g_m}{2} * v_i * \left(\dfrac{Z_{ds} * R_L}{Z_{ds} + R_L}\right)$ (e) Gain $(|A_V|) = \left|\dfrac{v_o}{v_i}\right|$
$= \dfrac{g_m}{2} * (Z_{ds} \| R_L)$
$= \dfrac{g_m}{2} * \left(\dfrac{Z_{ds} * R_L}{Z_{ds} + R_L}\right)$ (f) Gain $(|A_r|) = \left|\dfrac{i_o}{i_i}\right|$
$= \dfrac{g_m * v_i}{\dfrac{v_i}{Z_{gs}}}$
$= g_m Z_{gs}$ FIGS. 6A-6C illustrate a gain stage (or gain circuit) with an offset cancellation circuit according to an embodiment. In circuit 600 of FIG. 6A, offset compensation is performed by twin FETs $M_4$ and $M_5$, which source additional current from independent voltage source(s) $V_{EE}$. This configuration is referred to as a "bleeder" PMOS stage. Qualitatively, by sourcing more current, this configuration causes the FET transconductance $g_m \propto \sqrt{I_D}$ to increase, since now $g_m \propto \sqrt{I_D + I_P}$ where $I_p$ is the current sourced from a single branch FET, say, $M_4$, yielding a boost in current gain.

Under a low-frequency (or DC) offset condition, such as a 100 mV offset, a potential at one of the offset feedback terminals (for example, $M_4$) relative to the other causes one of the PMOS FET's ($M_4$) to begin to turn off, sourcing less current and causing an increased demand for current from voltage source $V_{DD}$. However, current from voltage source $V_{DD}$ is subject to a voltage drop across resistor $R_{L1}$, and the increased current (from voltage source $V_{DD}$ to the drain of $M_1$) through resistor $R_{L1}$ in the $M_1$ branch causes a desired decrease in the 100 mV voltage at the output (drain) of the respective output transistor ($M_1$). This decrease in voltage reduces the offset by the same amount of the offset due to the feedback offset signal received from the feedback path 225. The feedback offset signal, as discussed above with regard to FIGS. 2A and 2B, filters out the DC offset from the signal output by the gain stage 210 and applies such offset back to circuit 600. Thus, in the above example, the offset is 100 mV and the reduction in voltage caused by the circuit 600 of FIG. 6A is 100 mV. As such, the circuit 600 cancels the offset in the differential pair at the output of circuit 600.

After the offset is cancelled (which is almost instantaneously), the feedback offset correction signal adjusts in real time for any changes in DC offset due to changes in temperature, supply voltage, etc. For example, when an offset is present at the output nodes of the differential pair, the feedback offset correction signal is a positive (or possibly negative) value to compensate for such offset. Once the feedback offset correction signal is fed back to circuit 600, the offset should be compensated immediately. If the DC offset changes, the feedback offset correction signal then increases (or decreases) to such a value and feeds back into circuit 600 to compensate and correct for the offset. This process continues to repeat so that the offset is dynamically cancelled in real time, and relatedly so that the feedback offset correction signal does not continually apply a constant value at all times.

FIG. 6B illustrates the small-signal equivalent model 601 of the exemplary embodiment of circuit 600 with an added offset cancellation circuit, which is modeled as a DC current source $I_P$. The influence of the DC source to the small-signal model is simply to increase the FET transconductance to a value $g_m'$, resulting in a boost to the gain of the circuit. The reduced small-signal circuit 602 is shown in FIG. 6C. The resulting circuit equations are given below in Table 3.

TABLE 3

FIG 6A-6C OFFSET COMPENSATED DIFFERENTIAL PAIR PARAMETERS (CURRENT ENHANCEMENT)

(a) $v_{in} = v_i$ (b) $i_{in} = i_i = \dfrac{v_i}{Z_{gs}}$ (c) $g_{m'} = \sqrt{2\mu_m C_{OX}\left(\dfrac{W}{L}\right)(I_D + I_P)}$ $= g_m \sqrt{1 + \dfrac{I_P}{I_D}}$ (d) $v_{out} = v_o$ $= -g_{m'} * v_i * \left(\left(\dfrac{Z_{ds}}{2}\right) \| R_L\right)$ $= -g_{m'} * v_i * \left(\dfrac{Z_{ds}/2 * R_L}{Z_{ds}/2 + R_L}\right)$ (e) Gain $(|A_V|) = \left|\dfrac{v_o}{v_i}\right|$ $= g_m * (Z_{ds}/2 \| R_L)$ $= g_{m'} * \left(\dfrac{Z_{ds}/2 * R_L}{Z_{ds}/2 + R_L}\right).$ $\approx g_{m'} R_L (Z_{ds} \gg R_L)$ TABLE 3-continued

FIG 6A-6C OFFSET COMPENSATED DIFFERENTIAL PAIR PARAMETERS (CURRENT ENHANCEMENT)

(f) Gain $(|A_r|) = \left|\dfrac{i_o}{i_i}\right|$ $= \dfrac{g_{m'} * v_i}{\dfrac{v_i}{Z_{gs}}}$ $= g_{m'} Z_{gs}$ (g) Gain Boost: $\dfrac{g_{m'}}{g_m} = \sqrt{\dfrac{I_P + I_D}{I_D}}$ A benefit of the embodiment illustrated in FIGS. 6A-6C is that the offset cancellation and gain boosting tasks are simultaneously carried out by the additional PMOS offset cancellation stage. In optical transceiver applications, for example, it is frequently desirable to have a front-end high-gain stage in order to enhance the signal-to-noise ratio (SNR) prior to signal processing. In this situation, the PMOS gain boosting technique with the PMOS bleeder is a good candidate, because it offers an enhanced front-end gain, and does not require additional circuitry to simultaneously implement offset cancellation, which is mandatory in a front end circuit.

FIGS. 7A, 7B, 7C and 7D illustrate examples of a practical gain stage 220A-D (feedback amplifier 220 of FIG. 2B) for providing a feedback signal to the circuit of FIGS. 6A-6C. In the gain stage shown in FIG. 7A, for example, gates of M8 and M9 receive $V_{sense}+$ and $V_{sense}-$ from the gain stage 210 and drains of M8 and M9 output the feedback offset signal to the low-pass filter 230. These are just some examples that may be employed for feedback amplifier 220, and it should be understood that other variations are also possible.

Figure 8A:
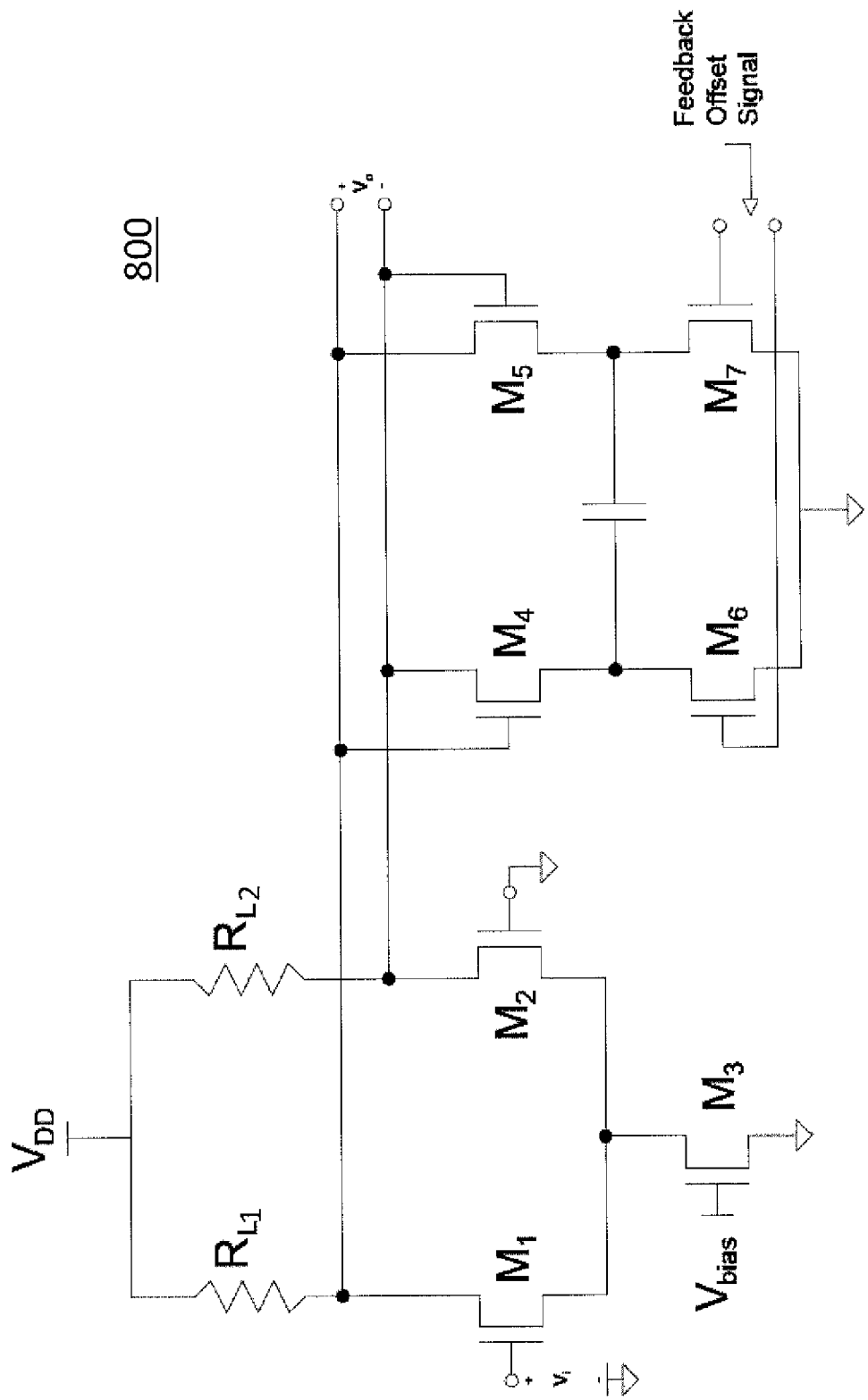
FIG. 8A illustrates a circuit including a first gain circuit having a transistor differential pair and an offset cancellation circuit according to yet another embodiment.
Figure 8B:
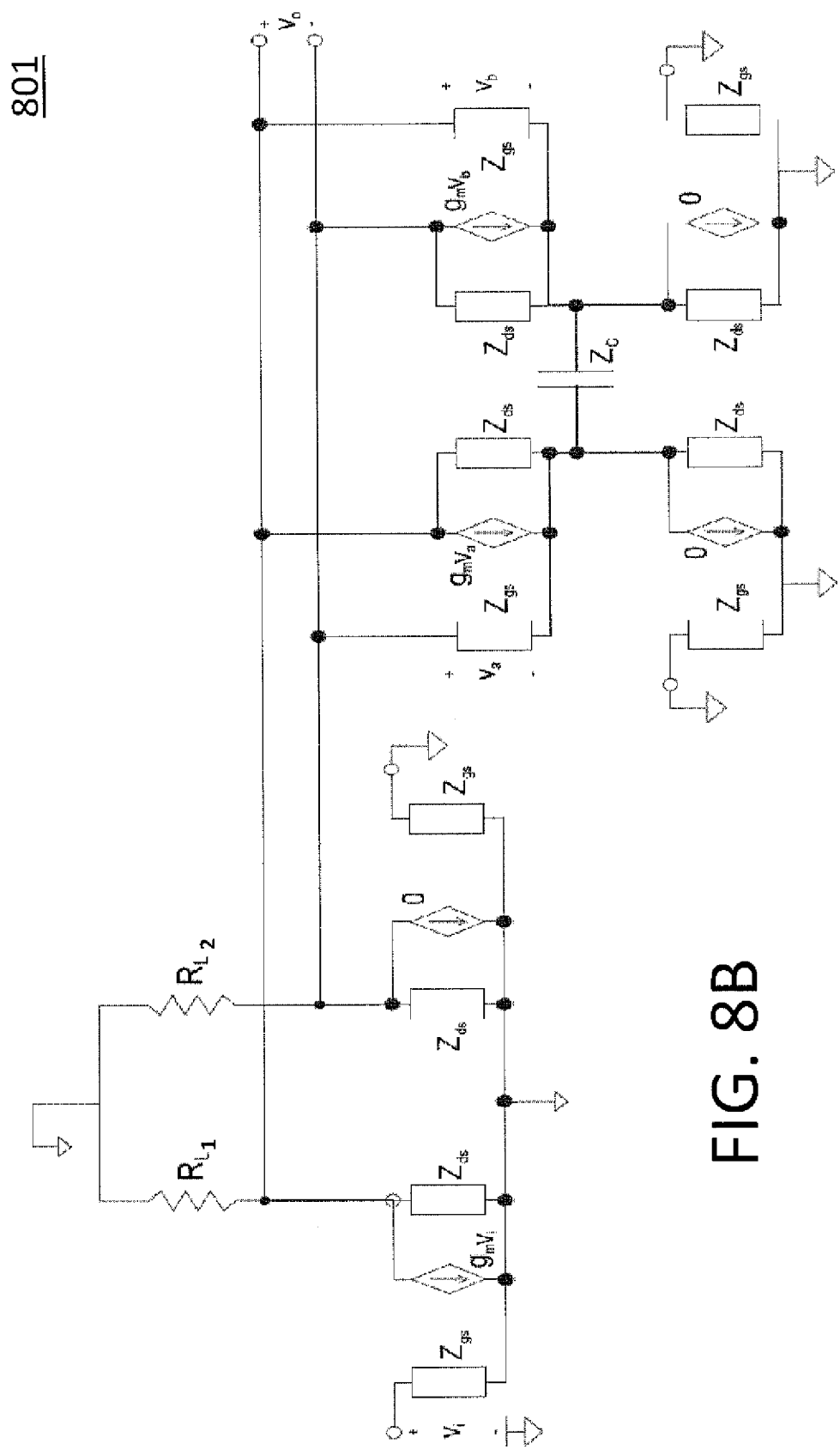
FIGS. 8B-8C illustrate equivalent circuits of the circuit of FIG. 8A.
Figure 8C:
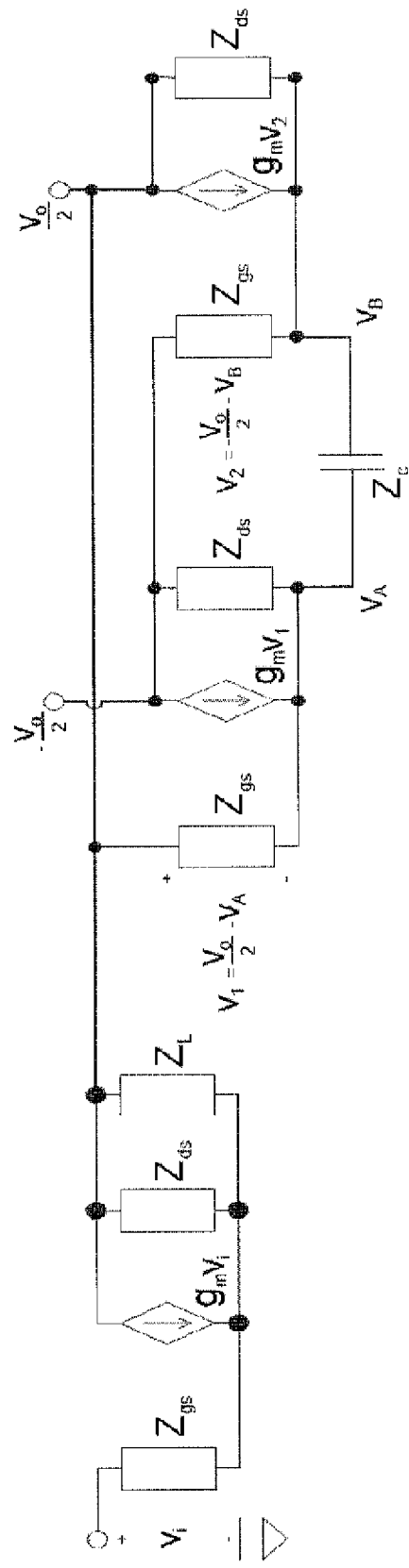

FIGS. 8A-8C illustrate another embodiment of gain circuit 800. In circuit 800 of FIG. 8A, offset compensation is performed by FETs $M_6$ and $M_7$, which sink additional current from the output $v_o$ through FETs $M_4$ and $M_5$. Qualitatively, this circuit acts similarly to the circuit 500 of FIG. 5 to perform low-frequency offset compensation in response to receiving the feedback offset correction signal. In circuit 800, an offset at one output terminal (e.g., the drain of $M_4$) relative to the other output terminal (e.g., the source of $M_4$) presents a potential on the gate of the FET ($M_4$), causing it to become more (or less) conductive. The offset will also return (without a signal component) to the feedback FET ($M_6$), causing it to also become more (or less) conductive. The result is a current sink from the output (e.g., the drain of $M_4$) through, for example, FET's $M_4$ and $M_6$. This creates an increase or decrease in current over one of the resistors (in this example, $R_{L2}$) which abuts the output voltage node that has the offset voltage. Such an increase (or decrease) in current over the respective resistor (e.g., $R_{L2}$) increases (or decreases, respectively) the voltage drop over such resistor so that the voltage at the output voltage node with the offset is equalized (e.g., an offset of 100 mV is then reduced by a 100 mV voltage drop). This modification of voltage on the output voltage node with the offset effectively eliminates the offset from the offset output voltage node relative to the other output voltage node and, thus, balances the circuit.

The configuration of FET $M_4$ and FET $M_6$ discussed above works when the offset is a positive offset between the output voltage nodes of the differential pair, while the configuration of FET $M_5$ and FET $M_7$ works in a similar manner but when the offset is a negative offset between the output voltage nodes of the differential pair. This is because the gate of FET $M_4$ is attached to the positive output voltage node while the gate of FET $M_6$ is attached to the negative output voltage node. The converse is true for the pair of FETs $M_5$ and $M_7$ in that the gate of FET $M_5$ is attached to the negative output voltage node while the gate of FET $M_7$ is attached to the positive output voltage node. Regardless, each pair, whether the FET pair of $M_4$ and $M_6$ or FET pair of $M_5$ and $M_7$, works in the same manner. The FET pair of $M_4$ and $M_6$, when activated by a positive offset on the output voltage of the differential pair, increases current through resistor $R_{L1}$ thereby lowering the voltage at the positive node of the output voltage, while the FET pair of $M_5$ and $M_7$, when activated by a negative offset on the output voltage of the differential pair, increases current through resistor $R_{L2}$ thereby decreasing the voltage at the negative node of the output voltage. In either case, the offset between the output nodes of the differential pair is cancelled when circuit 800 is in operation.

FIGS. 8B and 8C illustrate the small signal models 801, 802 of the circuit 800. In this configuration, the cross-connected FETs act like a negative impedance converter (NIC) in parallel with the output load of impedance $$Z_L = R_L + \frac{1}{sC_L}.$$

Figure 9A:
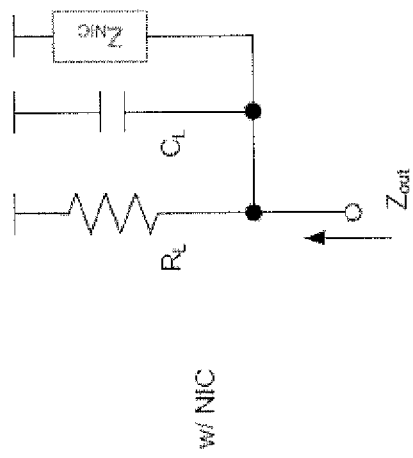
FIG. 9A illustrates a circuit having a negative impedance according to one embodiment.

This may also be evident from Table 5 equation (a), $$Z_{NIC} \approx -\frac{1}{sC}\frac{g_m + s(C_{gs} + 2C)}{g_m} = -\frac{1}{sC} - \frac{1}{Cg_m}(C_{gs} + 2C),$$

which represents a negative capacitance in series with a negative resistive term. The negative capacitance looks inductive $$\left(\frac{-1}{sC} = s\left(\frac{1}{C}\right)\right)$$

with a value or 1/C, and hence reduces the gain reducing effect of load capacitance '$C_L$' at high frequencies. The input impedance to the negative impedance converter $Z_{NIC}$ is shown in FIG. 9A looking into the cross-connected FET's, and the expression for $Z_{NIC}$ is given in equation (a) of Table 5 below. This expression is derived from FIG. 8C by open-circuiting each of the FET voltage controlled current sources and calculating the equivalent circuit impedance.

Figure 9B:
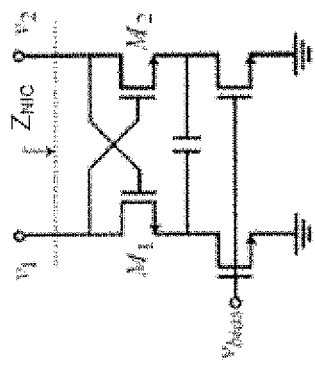
FIG. 9B illustrates an equivalent circuit of the circuit of FIG. 8A.
Figure 9C:
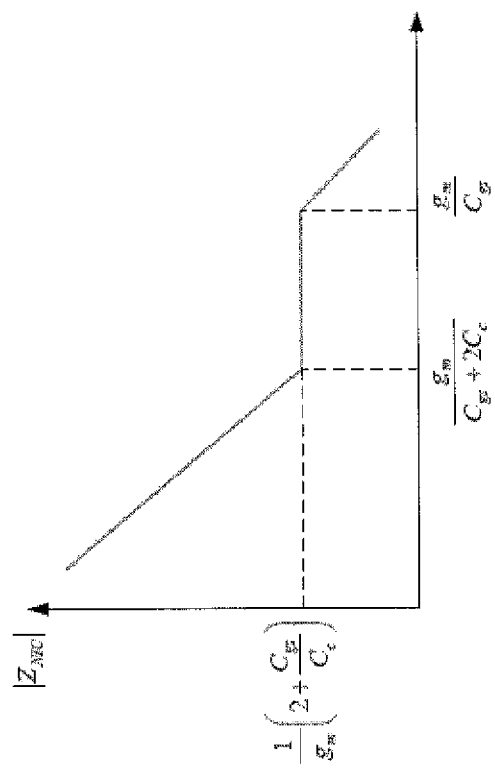
FIG. 9C illustrates a graph of the impedance of the circuit of FIG. 8A.
Figure 10:
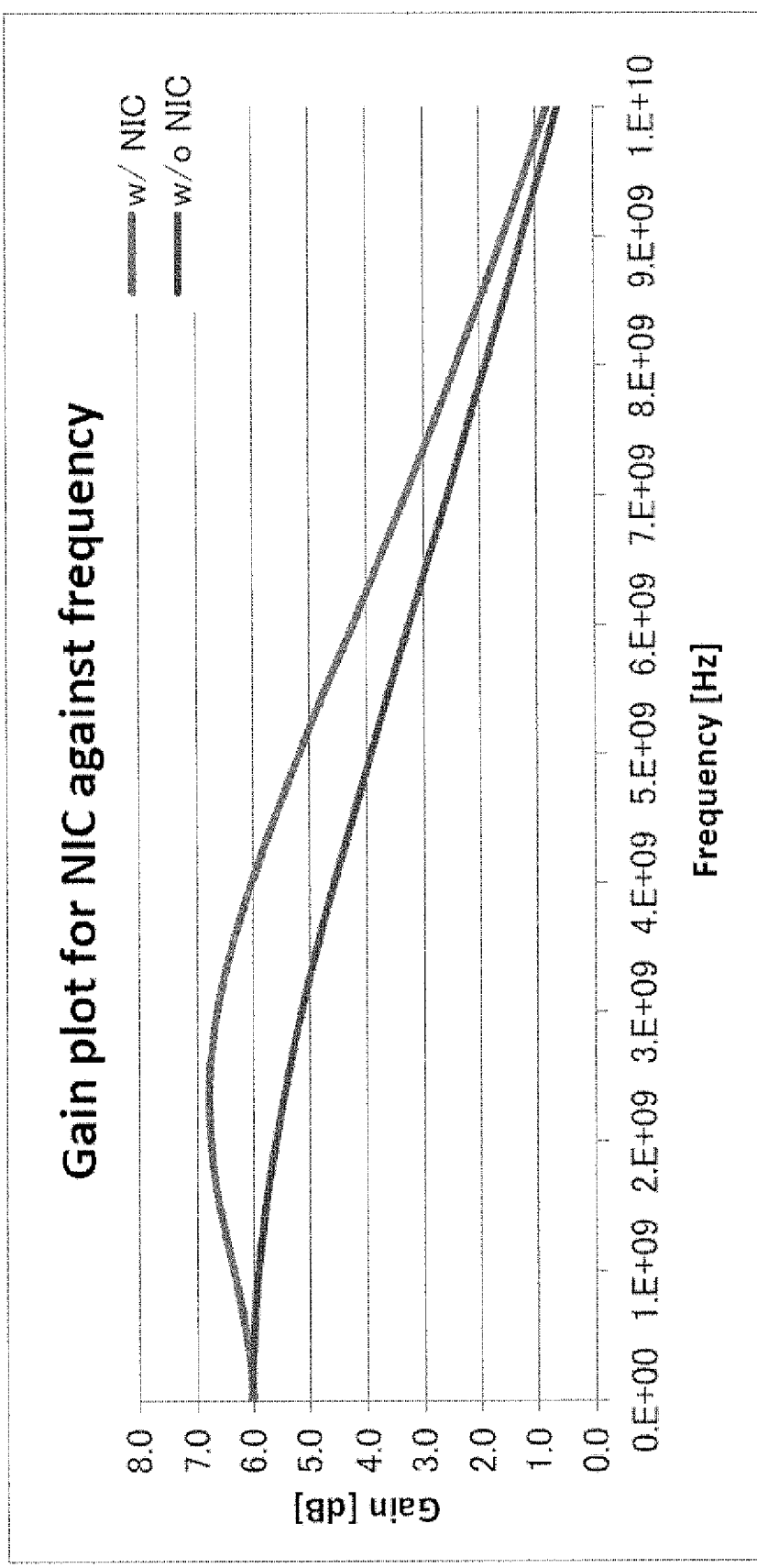
FIG. 10 illustrates a graph of a comparison of an impedance of a circuit with and without negative impedance according to an embodiment.

FIG. 9B illustrates the combined impedance of the load in parallel with the negative impedance converter stage. The net impedance, $Z_{out}$, may be re-written in the form of a transfer function describing a second order damped system, as indicated in Table 5, equation (b). Qualitatively, Table 5 equation (b) describes a system which implicitly contains a natural frequency of oscillation and a peak (resonant frequency). In equation (b), $w_n$ is the natural frequency of oscillation, and $\xi$ is the damping coefficient. A full analysis of second order damped system is omitted here, and it is assumed that such behavior will be familiar to one of ordinary skill in the art. The system behavior has a peak frequency $\omega_{peak}$ characterized by a pronounced gain, and it may be observed in FIG. 10 that the gain of the entire circuit with NIC is further increased across the frequency band as opposed to the circuit gain without the NIC stage. As such, the gain is effectively increased for an entire bandwidth with circuit 800. FIG. 9C illustrates the magnitude of $Z_{NIC}$ as a function of frequency.

TABLE 5

OFFSET COMPENSATED DIFFERENTIAL PAIR
PARAMETERS (BANDWIDTH ENHANCEMENT)

(a) $$Z_{NIC} = -\frac{1}{sC}\frac{g_m + s(C_{gs} + 2C)}{g_m - sC_{gs}}$$
$$\approx -\frac{1}{sC}\frac{g_m + s(C_{gs} + 2C)}{g_m}, (s << f_T)$$

(b) $$Z_{OUT} = \frac{R_L}{1 + sR_L C_L}\|Z_{NIC}$$
$$= \frac{(2sC + sC_{gs} + g_m)R_L}{2sC(1 + sR_L C_L) + g_m(1 + sR_L(C_L - C) + sC_{gs}(1 + sR_L(C_L + C))}$$
$$= \frac{w_n^2 R_L(1 + sA)}{s^2 + 2\xi w_n s + w_n^2}$$

DEF.: $A = \frac{C_{gs} + 2C}{g_m}$, $W_n^2$
$$= \frac{g_m}{R_L C_L(C_{gs} + 2C) + C_{gs} C R_L}, \xi$$
$$= \frac{w_n}{2}(R_L(C_L - C) + A$$

(c) $$\omega_{-3dB} = w_n \sqrt{\frac{-(2\xi^2 - 1 - A^2 w_n^2) + }{\sqrt{(2\xi^2 - 1 - A^2 w_n^2)^2 + 1}}}$$

(d) $$\omega_{peak} = \sqrt{\frac{-1 + \sqrt{1 - A^2 w_n^2(2(2\xi^2 - 1) - A^2 w_n^2}}{A^2}}$$

(e) $$\text{Peaking} = \sqrt{\frac{w_n^2(1 + A^2 \omega_{peak}^2)}{\omega_{peak}^4 + 2(2\xi^2 - 1)w_n^2 \omega_{peak}^2 + w_n^4}}$$

(f) $$\text{Bandwidth Extansion} = \frac{w_n \sqrt{\frac{-(2\xi^2 - 1 - A^2 w_n^2) + }{\sqrt{(2\xi^2 - 1 - A^2 w_n^2)^2 + 1}}}}{\frac{1}{R_L C_L}}$$

Equation (f) denotes the bandwidth boosting property of circuit 800, where the bandwidth extension has been given as the ratio of the 3 dB frequency of circuit 800 divided by the cutoff frequency $\omega_{op}$ of an un-compensated differential pair circuit 400 with load resistance $R_L$ (and an added load capacitance term $C_L$).

Figure 11:
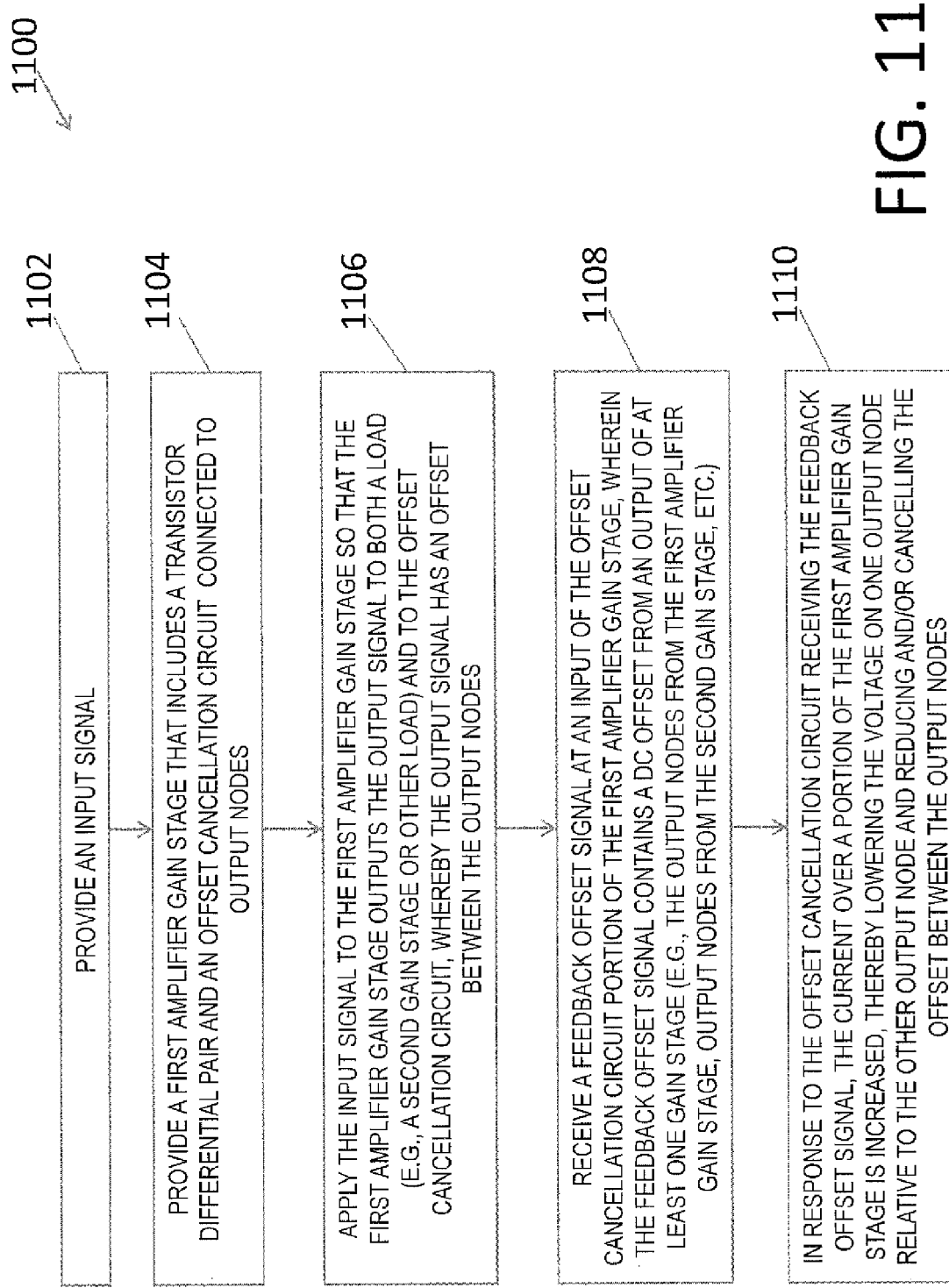
FIG. 11 illustrates a method of canceling offset in a gain circuit in accordance with an embodiment

FIG. 11 illustrates a method 1100 of canceling offset in a gain circuit in accordance with an embodiment. At 1102, an input signal is provided to a first amplifier gain stage or circuit. The input signal may be provided by a signal source generator or other type of signal source.

At 1104, the first amplifier gain stage or circuit is provided similar to one of the embodiments as discussed above. In this regard, the first amplifier gain stage may include a transistor differential pair and an offset cancellation circuit, both of which are connected to the output nodes.

At 1106, the differential pair receives the applied input signal and outputs an output signal with gain to the output nodes, as previously described. The output signal initially includes an offset on the base signal. The output signal may be applied to a load, such as a second amplifier gain stage or circuit. Additionally, the output signal may also be applied to the offset cancellation circuit.

At 1108, a feedback offset correction signal is received at an input of the offset cancellation portion of the first amplifier stage. As discussed above, the feedback offset correction signal may be a signal that has been filtered using a low-pass filter 230 through the feedback loop 225 so that the feedback offset correction signal only contains the low-frequency or DC offset of the base signal.

At 1110, the offset cancellation circuit causes the current over a portion (e.g., a resistor in series with a constant voltage source) of the first amplifier gain stage or circuit is increased in response to the offset cancellation circuit receiving the feedback offset correction signal. This effectively changes the voltage on one of the output nodes of the first gain stage or circuit relative to the other output node, thereby cancelling an offset between the output nodes.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A system comprising:
   a first gain circuit comprising:
   a pair of input nodes configured to receive an input signal;
   a transistor circuit connected to the pair of input nodes and configured to convert the input signal to an output signal, where the output signal has a gain compared with the input signal; and
   a pair of output nodes configured to receive the output signal from the transistor circuit before the first gain circuit receives a feedback offset correction signal;
   wherein, in response to the first gain circuit receiving the feedback offset correction signal, the first gain circuit causes a voltage change at one of the output nodes relative to another output node thereby cancelling at least a portion of an offset in the output signal;
   wherein the first gain circuit comprises an offset cancellation circuit that is configured to receive the feedback offset correction signal from a feedback path independent from receiving the output signal from the transistor circuit, and
   wherein the pair of input nodes, which are included in the first gain circuit and configured to receive the input signal, are connected to the transistor circuit, which is included in the first gain circuit and configured to convert the input signal to the output signal, where the output signal has a gain compared with the input signal, the pair of output nodes, which are included in the first gain circuit and configured to receive the output signal from the transistor circuit before the first gain circuit receives a feedback offset correction signal, are connected to the transistor circuit, and the offset cancellation circuit, which is included in the first gain circuit and configured to receive the feedback offset correction signal from the feedback path independent from receiving the output signal from the transistor circuit, is connected to the feedback path.

2. The system of claim 1, wherein the first gain circuit further comprises a transistor differential pair, and wherein the offset cancellation circuit simultaneously boosts a gain of the differential pair and cancels the offset from the output of the differential pair.

3. The system of claim 2, wherein, for an output frequency band of the differential pair above a predetermined gain level, the offset cancellation circuit further increases the gain of the differential pair across the output frequency band without reducing the width of the frequency band.

4. The system of claim 2, wherein the offset comprises a low-frequency offset so that the output signal comprises a low-frequency offset.

5. The system of claim 4, wherein the low-frequency offset comprises a DC offset so that the voltage between the output nodes includes a DC offset.

6. The system of claim 1, wherein the offset cancellation circuit is further configured to receive the output signal from the transistor circuit as well as receive the feedback offset correction signal.

7. The system of claim 6, wherein the offset cancellation circuit is configured to cause a change in voltage drop across a resistor in the first gain circuit in response to receiving the feedback offset correction signal, thereby reducing the offset between the output nodes.

8. The system of claim 7, wherein the first gain circuit comprises a first resistor in series with a constant voltage source, and
   wherein the change in voltage drop is caused by the offset cancellation circuit changing a current over the first resistor so that a low-frequency voltage at one of the output nodes is modified relative to the other output node.

9. The system of claim 6, wherein the first gain circuit further comprises a transistor differential pair, the transistor differential pair comprising the input nodes and the output nodes.

10. The system of claim 9, wherein the transistor differential pair comprises:
    a constant voltage source;
    a first transistor,
    wherein a first output node is disposed between a first resistor and the first transistor, and
    wherein the gate of the first transistor is connected to a first input voltage;
    a second resistor in series with the constant voltage source and a second transistor,
    wherein a second output node is disposed between a first resistor and the first transistor, and
    wherein the gate of the second transistor is connected to a second input voltage; and
    a third transistor sharing a node with both the first and second transistors at a source of the third transistor.

11. The system of claim 10, wherein the offset cancellation circuit comprises:
    a fourth transistor comprising a gate, a drain and a source,
    wherein the source of the fourth transistor is connected to the first output node;
    a fifth transistor comprising a gate, a drain and a source,
    wherein the source of the fifth transistor is connected to the second output node; and
    a second constant voltage source connected to the drains of the fourth and fifth transistors,
    wherein the feedback offset signal is connected between the gates of the fourth and fifth transistors.

12. The system of claim 10, wherein the offset cancellation circuit comprises:
a fourth transistor,
wherein a gate of the fourth transistor is connected to the first output node and a drain of the fourth transistor is connected to the second output node;
a fifth transistor,
wherein a gate of the fifth transistor is connected to the second output node and a drain of the fifth transistor is connected to the first output node;
a sixth transistor comprising a gate, a drain and a source,
wherein the drain of the sixth transistor is connected to source of the fourth transistor, and wherein the source of the sixth transistor is connected to ground; and
a seventh transistor comprising a gate, a drain and a source,
wherein the drain of the seventh transistor is connected to source of the fifth transistor, and
wherein the source of the seventh transistor is connected to ground,
wherein the feedback offset signal is connected between the gates of the sixth and seventh transistors.

13. The system of claim 1, further comprising
a second gain circuit,
wherein the output nodes of the first gain circuit are connected to an input of the second gain circuit, the second gain circuit being configured to output a second output signal to the feedback path.

14. The system of claim 1, wherein the output signal initially comprises a base signal and a DC offset, and
wherein the feedback path comprises a low-pass filter configured to filter out the base signal resulting in the feedback offset correction signal so that the feedback offset correction signal comprises the DC offset but not the base signal.

15. The system of claim 1, wherein the offset is created by random variations in common-mode of a differential signal between amplifiers in an amplifier chain.

16. A circuit for cancelling offset, the circuit comprising:
a feedback path comprising a low-pass filter; and
a first gain circuit comprising:
an input to receive an input signal;
a pair of output nodes comprising a first output node and a second output node which collectively output a first output before the first gain circuit receives a feedback offset signal;
a transistor differential pair attached to the input and configured to convert the input signal to the first output signal at the output nodes;
an offset cancellation circuit connected to the output nodes and configured to receive the feedback offset signal from the feedback path independent from receiving the output signal from the transistor differential pair;
wherein, in response to the offset cancellation circuit receiving the feedback offset signal, the first gain circuit changes the voltage at the first output node relative to the second output node to cancel an offset between the output nodes, and
wherein the input, which is included in the first gain circuit and receives the input signal, is connected to the transistor differential pair, which is included in the first gain circuit and configured to convert the input signal to the first output signal, the pair of output nodes, which are included in the first gain circuit and collectively output a first output before the first gain circuit receives a feedback offset signal, are connected to the transistor differential pair, and the offset cancellation circuit, which is included in the first gain circuit and configured to receive the feedback offset signal from the feedback path independent from receiving the output signal from the transistor differential pair, is connected to the feedback path.

17. The circuit of claim 16, further comprising at least one amplifier gain circuit attached to the output nodes of the first gain circuit,
wherein a second output signal is output by the at least one amplifier gain circuit and initially comprises the offset.

18. The circuit of claim 16, wherein the offset cancellation circuit is configured to cause a change in voltage drop from a constant voltage source in the transistor differential pair in response to receiving the feedback offset signal, thereby reducing the offset between the output nodes.

19. The circuit of claim 18, wherein the transistor differential pair comprises
a first transistor connected to the first output node,
a second transistor connected to the second output node, and
a resistor disposed between the constant voltage source and the first output node, and
wherein the voltage drop is caused by the offset cancellation circuit changing a current over the resistor so that a voltage at one of the output nodes is modified relative to the other output node.

20. The circuit of claim 18, wherein the offset cancellation circuit comprises:
a third transistor comprising a gate, a drain and a source,
wherein the source of the third transistor is connected to the first output node;
a fourth transistor comprising a gate, a drain and a source,
wherein the source of the fourth transistor is connected to the second output node; and
a second constant voltage source connected to the drains of the third and fourth transistors,
wherein the feedback offset signal is connected between the gates of the third and fourth transistors.

21. The circuit of claim 18, wherein the offset cancellation circuit comprises:
a fourth transistor,
wherein a gate of the fourth transistor is connected to the first output node and a drain of the fourth transistor is connected to the second output node;
a fifth transistor,
wherein a gate of the fifth transistor is connected to the second output node and a drain of the fifth transistor is connected to the first output node;
a sixth transistor comprising a gate, a drain and a source,
wherein the drain of the sixth transistor is connected to source of the fourth transistor, and
wherein the source of the sixth transistor is connected to ground; and
a seventh transistor comprising a gate, a drain and a source,
wherein the drain of the seventh transistor is connected to source of the fifth transistor, and
wherein the source of the seventh transistor is connected to ground,
wherein the feedback offset signal is connected between the gates of the sixth and seventh transistors.

22. The circuit of claim 16, wherein the feedback path further comprises a third gain circuit.

23. The circuit of claim 21, wherein the third gain circuit comprises a gain of about one so that the third gain circuit acts as a buffer.

24. The circuit of claim 21, wherein the third gain circuit is connected to the output of the low-pass filter.

25. The circuit of claim 21, wherein the third gain circuit is connected to the input of the low-pass filter, so that the feedback offset signal is delivered from the low-pass filter to the first gain circuit.

26. A method comprising:
receiving an input signal at a first gain circuit, the first gain circuit comprising a transistor differential pair and an offset cancellation circuit;
outputting an output signal to a pair of output nodes before the first gain circuit receives a feedback offset correction signal, so that the output signal has a gain relative to the input signal;
receiving, at the offset cancellation circuit and independent from receiving the output signal, the feedback offset correction signal from a feedback path,
wherein the feedback path is configured to filter a low-frequency offset from the output signal; and
cancelling an offset at one of output nodes in response to the first gain circuit receiving the feedback offset correction signal,
wherein the pair of output nodes are included in the first gain circuit and output the output signal before the first gain circuit receives the feedback offset correction signal and the offset cancellation circuit, which is included in the first gain circuit and receives the feedback offset correction signal from the feedback path independent from receiving the output signal, is connected to the feedback path.

27. The method of claim 26, wherein the offset cancellation circuit receives both the output signal and the feedback offset correction signal.

28. The method of claim 26, wherein the first gain circuit simultaneously boosts the gain of the input signal while correcting offset using the offset signal.

29. The method of claim 26, wherein the feedback path comprises a low-pass filter which filters a base signal from the output signal, resulting in the feedback offset correction signal which is fed back to the first gain circuit.

30. The method of claim 26, wherein an output from the low-pass filter is transmitted to another gain circuit that acts as a buffer.

31. The method of claim 26, wherein the cancelling the offset comprises the offset cancellation circuit causing an increase in voltage drop from a constant voltage source in the first gain circuit, thereby reducing the offset between the output nodes.

32. The method of claim 26, wherein the first gain circuit comprises a first resistor in series with the constant voltage source, and wherein the voltage drop is caused by the offset cancellation circuit increasing current over the first resistor so that a voltage at one of the output nodes is reduced relative to the other output node.

* * * * *